United States Patent
Park et al.

(10) Patent No.: US 12,218,133 B2
(45) Date of Patent: Feb. 4, 2025

(54) THREE-DIMENSIONAL SEMICONDUCTOR DEVICE AND METHOD OF FABRICATING THE SAME

(71) Applicant: SAMSUNG ELECTRONICS CO., LTD., Suwon-si (KR)

(72) Inventors: Sungil Park, Suwon-si (KR); Jae Hyun Park, Hwaseong-si (KR); Daewon Ha, Seoul (KR); Kyuman Hwang, Daejeon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 424 days.

(21) Appl. No.: 17/805,261

(22) Filed: Jun. 3, 2022

(65) Prior Publication Data
US 2023/0138121 A1 May 4, 2023

(30) Foreign Application Priority Data
Oct. 28, 2021 (KR) ........................ 10-2021-0145770

(51) Int. Cl.
*H01L 29/78* (2006.01)
*H01L 21/02* (2006.01)
(Continued)

(52) U.S. Cl.
CPC .... *H01L 27/0922* (2013.01); *H01L 21/02532* (2013.01); *H01L 21/0259* (2013.01);
(Continued)

(58) Field of Classification Search
CPC ........... H01L 27/0922; H01L 21/02532; H01L 21/0259; H01L 21/8221; H01L 21/823807; H01L 21/823814; H01L 21/823857; H01L 21/823878; H01L 29/0665; H01L 29/42392; H01L 29/66742; H01L 29/6684; H01L 29/78391; H01L 29/78696; H01L 21/28185; H01L 29/165; H01L 29/41766; H01L 29/42372; H01L 29/4966; H01L 29/513; H01L 29/7848; H01L 21/823842;
(Continued)

(56) References Cited

U.S. PATENT DOCUMENTS 10,510,622 B1 12/2019 Frougier et al.
10,714,391 B2 7/2020 Smith et al.
(Continued)

*Primary Examiner* — Elias Ullah
(74) *Attorney, Agent, or Firm* — F. CHAU & ASSOCIATES, LLC

(57) ABSTRACT

Provided is a three-dimensional semiconductor device and its fabrication method. The semiconductor device includes a first active region on a substrate and including a plurality of lower channel patterns and a plurality of lower source/drain patterns that are alternately arranged along a first direction, a second active region on the first active region and including a plurality of upper channel patterns and a plurality of upper source/drain patterns that are alternately arranged along the first direction, a first gate electrode on a first lower channel pattern of the lower channel patterns and on a first upper channel pattern of the upper channel patterns, and a second gate electrode on a second lower channel pattern of the lower channel patterns and on a second upper channel pattern of the upper channel patterns. The second gate electrode may include lower and upper gate electrodes with an isolation pattern interposed therebetween.

20 Claims, 36 Drawing Sheets

(51) Int. Cl.
- *H01L 21/822* (2006.01)
- *H01L 21/8238* (2006.01)
- *H01L 27/092* (2006.01)
- *H01L 29/06* (2006.01)
- *H01L 29/423* (2006.01)
- *H01L 29/66* (2006.01)
- *H01L 29/786* (2006.01)

(52) U.S. Cl.
CPC .. *H01L 21/8221* (2013.01); *H01L 21/823807* (2013.01); *H01L 21/823814* (2013.01); *H01L 21/823857* (2013.01); *H01L 21/823878* (2013.01); *H01L 29/0665* (2013.01); *H01L 29/42392* (2013.01); *H01L 29/66742* (2013.01); *H01L 29/6684* (2013.01); *H01L 29/78391* (2014.09); *H01L 29/78696* (2013.01)

(58) Field of Classification Search
CPC ............... H01L 27/0688; H01L 27/092; H01L 29/0673; H01L 29/517; H01L 29/66439; H01L 29/66545; H01L 29/775; H01L 21/8238; H01L 21/823828; H01L 21/823871; H01L 29/0847; B82Y 10/00
See application file for complete search history.

(56) References Cited

U.S. PATENT DOCUMENTS

| | | |
|---|---|---|
| 10,833,078 B2 | 11/2020 | Smith et al. |
| 10,991,711 B2 | 4/2021 | Reznicek et al. |
| 2020/0098756 A1 | 3/2020 | Lilak et al. |
| 2020/0105751 A1 | 4/2020 | Dewey et al. |
| 2020/0105891 A1 | 4/2020 | Lilak et al. |
| 2020/0219970 A1 | 7/2020 | Mannebach et al. |
| 2021/0028169 A1 | 1/2021 | Smith et al. |
| 2021/0202481 A1 | 7/2021 | Fulford et al. |

THREE-DIMENSIONAL SEMICONDUCTOR DEVICE AND METHOD OF FABRICATING THE SAME

CROSS-REFERENCE TO RELATED APPLICATION

This U.S. nonprovisional application claims priority under 35 U.S.C. § 119 to Korean Patent Application No. 10-2021-0145770, filed on Oct. 28, 2021, in the Korean Intellectual Property Office, the disclosure of which is incorporated by reference herein in its entirety.

TECHNICAL FIELD

The present inventive concept relates to a three-dimensional semiconductor device and a method of fabricating the same, and more particularly, to a three-dimensional semiconductor device including a field effect transistor and a method of fabricating the same.

DISCUSSION OF RELATED ART

A semiconductor device includes an integrated circuit including metal oxide semiconductor field effect transistors (MOSFETs). As design rules of the semiconductor device are reduced in accordance with an increasing demand for the semiconductor device to have a smaller pattern size and higher performance, sizes of the MOSFETs are also being aggressively scaled down. The scale down of MOSFETs may deteriorate operating characteristics of the semiconductor device. Accordingly, various studies have been conducted to develop methods of fabricating semiconductor devices having superior performances while overcoming limitations caused by high integration of the semiconductor devices.

SUMMARY

Embodiments of the present inventive concept provide a three-dimensional semiconductor memory device with increased integration.

Embodiments of the present inventive concept provide a method of fabricating a semiconductor device with increased integration.

According to an embodiment of the present inventive concept, a three-dimensional semiconductor device may include: a first active region on a substrate, the first active region including a plurality of lower channel patterns and a plurality of lower source/drain patterns that are alternately arranged along a first direction; a second active region on the first active region, the second active region including a plurality of upper channel patterns and a plurality of upper source/drain patterns that are alternately arranged along the first direction; a first gate electrode on a first lower channel pattern of the lower channel patterns and on a first upper channel pattern of the upper channel patterns; and a second gate electrode on a second lower channel pattern of the lower channel patterns and on a second upper channel pattern of the upper channel patterns. The first gate electrode may include: a first lower gate electrode on the first lower channel pattern; and a first upper gate electrode on the first upper channel pattern. The first lower gate electrode and the first upper gate electrode may be connected to each other. The second gate electrode may include: a second lower gate electrode on the second lower channel pattern; a second upper gate electrode on the second upper channel pattern; and an isolation pattern between the second lower gate electrode and the second upper gate electrode. The second lower gate electrode and the second upper gate electrode may be separated from each other by the isolation pattern.

According to an embodiment of the present inventive concept, a three-dimensional semiconductor device may include: a first active region on a substrate and a second active region on the first active region; a first gate electrode and a second gate electrode on the first active region and the second active region, in which the first gate electrode includes a first lower gate electrode on the first active region, a first upper gate electrode on the second active region, and a first isolation pattern between the first lower gate electrode and the first upper gate electrode, and in which the second gate electrode includes a second lower gate electrode on the first active region, a second upper gate electrode on the second active region, and a second isolation pattern between the second lower gate electrode and the second upper gate electrode; a first upper gate contact coupled to the first upper gate electrode; a first lower gate contact coupled to the first lower gate electrode; a second upper gate contact coupled to the second upper gate electrode; a second lower gate contact coupled to the second lower gate electrode; a first wiring line electrically connected to the first upper gate contact and the second lower gate contact; and a second wiring line electrically connected to the first lower gate contact and the second upper gate contact.

According to an embodiment of the present inventive concept, a three-dimensional semiconductor device may include: a first active region on a substrate, the first active region including a lower channel pattern and a lower source/drain pattern connected to the lower channel pattern; a second active region on the first active region, the second active region including an upper channel pattern and an upper source/drain pattern connected to the upper channel pattern; a dummy channel pattern between the lower channel pattern and the upper channel pattern; and a gate electrode on the lower channel pattern, the dummy channel pattern, and the upper channel pattern. The gate electrode may include: a lower gate electrode on the lower channel pattern; an upper gate electrode on the upper channel pattern; and an isolation pattern between the lower gate electrode and the upper gate electrode.

According to an embodiment of the present inventive concept, a method of fabricating a three-dimensional device may include: forming on a substrate a stack layer in which a first active layer, a first sacrificial layer, a second sacrificial layer, a third sacrificial layer, and a second active layer are sequentially stacked; patterning the stack layer to form a stack pattern that extends in a first direction, the stack pattern including a lower stack pattern and an upper stack pattern, the lower stack pattern including the first active layer and the first sacrificial layer, and the upper stack pattern including the third sacrificial layer and the second active layer; forming on the stack pattern a sacrificial pattern that extends in a second direction; forming an interlayer dielectric layer that covers the stack pattern and the sacrificial pattern; selectively removing the sacrificial pattern to form an outer region that exposes the stack pattern; using the outer region to replace the second sacrificial layer of the stack pattern with a dummy channel pattern; removing the first sacrificial layer and the third sacrificial layer of the stack pattern through the outer region to respectively form a first inner region and a second inner region; forming a lower gate electrode that fills the first inner region; forming an isolation pattern on the lower gate electrode; and forming on the isolation pattern an upper gate electrode that fills the second inner region.

BRIEF DESCRIPTION OF THE DRAWINGS

The above and other aspects and features of the present inventive concept will be more clearly understood from the following detailed description, taken in conjunction with the accompanying drawings, in which.

Figure 1:
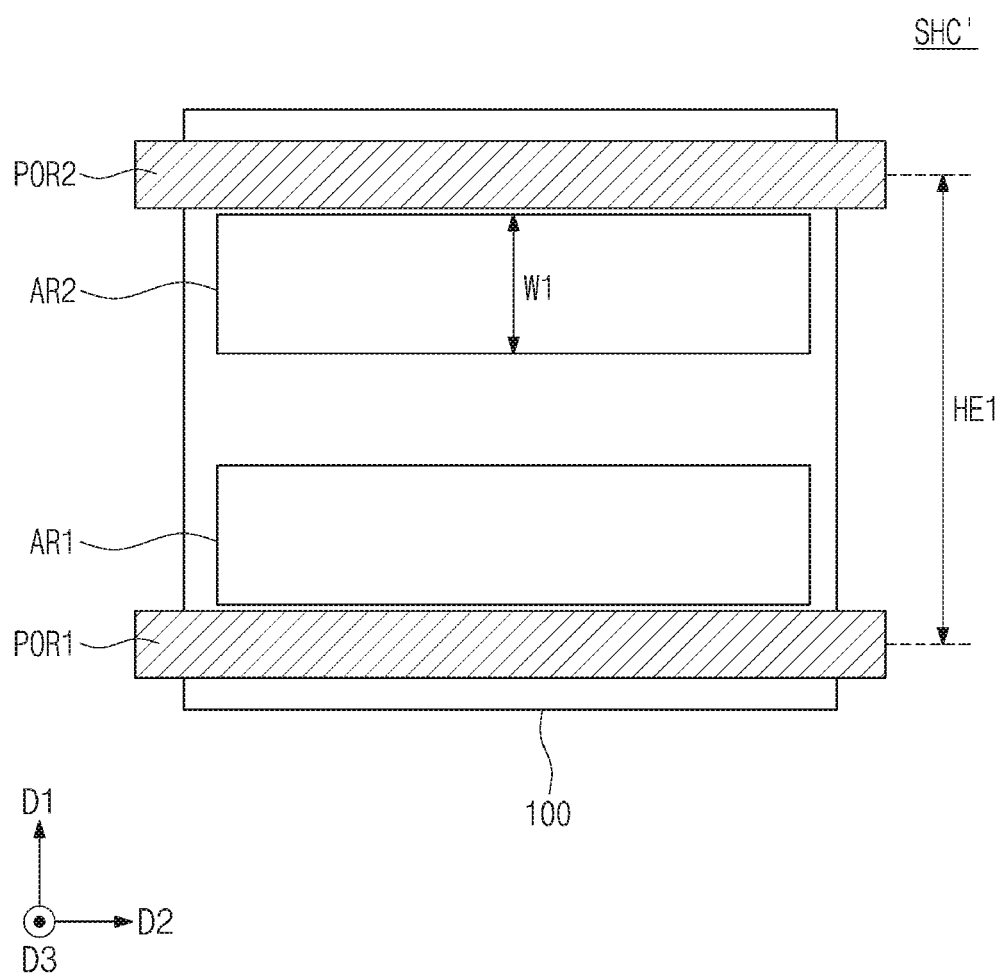
FIG. 1 illustrates a conceptual diagram showing a logic cell of a semiconductor device according to a comparative example of the present inventive concepts.

Since the drawings in FIGS. 1-22 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

FIG. 1 illustrates a conceptual diagram showing a logic cell of a semiconductor device according to a comparative example of the present inventive concept. FIG. 1 shows a logic cell of a two-dimensional device according to a comparative example of the present inventive concept.

Referring to FIG. 1, a single height cell SHC' may be provided. For example, a substrate 100 may be provided thereon with a first power line POR1 and a second power line POR2. One of the first and second power lines POR1 and POR2 may be provided with a drain voltage (VDD) or a power voltage. The other of the first and second power lines POR1 and POR2 may be provided with a source voltage (VSS) or a ground voltage. For example, the source voltage (VSS) may be applied to the first power line POR1, and the drain voltage (VDD) may be applied to the second power line POR2.

The single height cell SHC' may be defined between the first power line POR1 and the second power line POR2. The single height cell SHC' may include a first active region AR1 and a second active region AR2. One of the first and second active regions AR1 and AR2 may be a p-channel metal oxide semiconductor field effect transistor (PMOSFET) region, and the other of the first and second active regions AR1 and AR2 may be an n-channel metal oxide semiconductor field effect transistor (NMOSFET) region. For example, the first active region AR1 may be an NMOSFET region, and the second active region AR2 may be a PMOSFET region. For example, the single height cell SHC' may have a complementary metal oxide semiconductor (CMOS) structure provided between the first power line POR1 and the second power line POR2 so as to use complementary and symmetrical pairs of PMOSFET and NMOSFET for logic functions.

A semiconductor device according to a comparative example may be a two-dimensional device in which transistors of a front-end-of-line (FEOL) layer are arranged two-dimensionally. For example, NMOSFETs on the first active region AR1 may be spaced apart in a first direction D1 from PMOSFETs on the second active region AR2.

The first and second active regions AR1 and AR2 may each have a first width W1 in the first direction D1. A first height HE1 may be defined to indicate a length in the first direction D1 of the single height cell SHC' according to a comparative example. The first height HE1 may be substantially the same as a distance (e.g., pitch) between the first power line POR1 and the second power line POR2.

The single height cell SHC' may constitute one logic cell. In this description, the logic cell may mean a logic device, such as, for example, AND, OR, XOR, XNOR, or inverter, that performs a specific function. For example, the logic cell may include transistors for constituting a logic device, and may also include wiring lines that connect the transistors to each other.

Because a two-dimensional device is included in the single height cell SHC' according to a comparative example, the first active region AR1 and the second active region AR2 may be disposed spaced apart from each other in the first direction D1 without overlapping each other. Therefore, it may be required that the first height HE1 of the single height cell SHC' be defined to include all of the first and second active regions AR1 and AR2 that are spaced apart from each other in the first direction D1. As a result, the first height HE1 of the single height cell SHC' according to a comparative example may be required to become relatively large. Therefore, the single height cell SHC' according to a comparative example may have a relatively large area.

Figure 2:
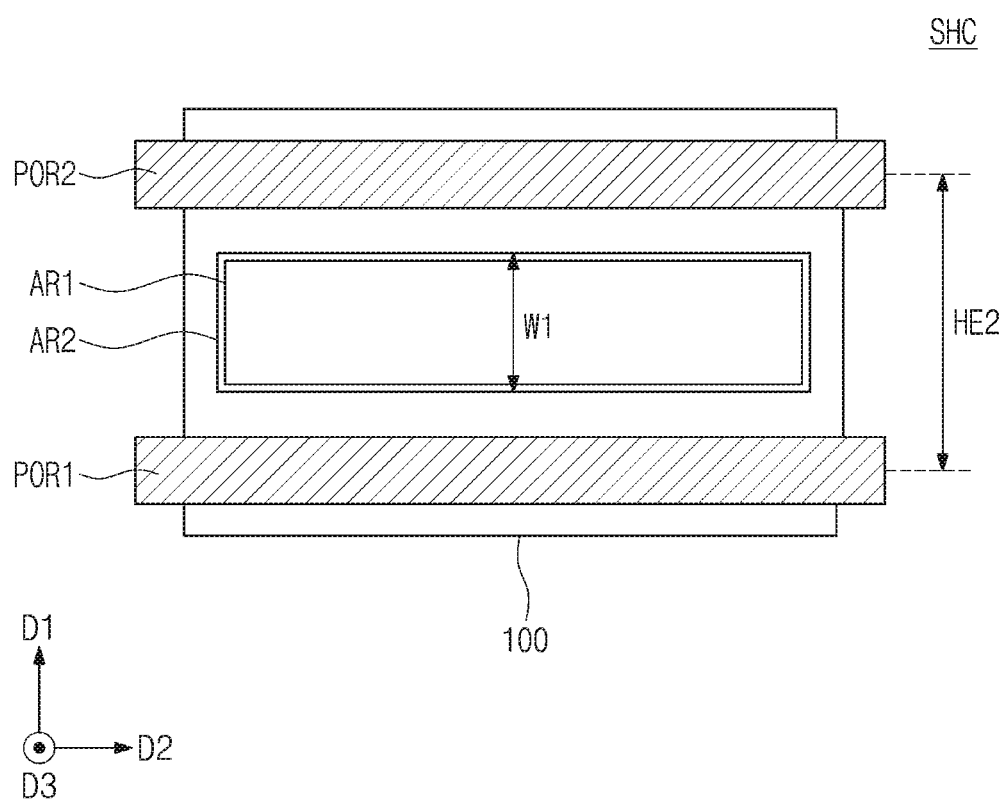
FIG. 2 illustrates a conceptual view showing a logic cell of a semiconductor device according to an embodiment of the present inventive concept.

FIG. 2 illustrates a conceptual view showing a logic cell of a semiconductor device according to an embodiment of the present inventive concept. FIG. 2 depicts a logic cell of a three-dimensional device according to an embodiment of the present inventive concept.

Referring to FIG. 2, a single height cell SHC may be provided to include a three-dimensional device such as a stacked transistor. For example, a substrate 100 may be provided thereon with a first power line POR1 and a second power line POR2. The single height cell SHC may be defined between the first power line POR1 and the second power line POR2.

The single height cell SHC may include a first active region AR1 and a second active region AR2. One of the first and second active regions AR1 and AR2 may be a PMOSFET region, and the other of the first and second active regions AR1 and AR2 may be an NMOSFET region.

A semiconductor device according to an embodiment of the present inventive concept may be a three-dimensional device in which transistors of a front-end-of-line (FEOL) layer are stacked vertically. The substrate 100 may be provided thereon with the first active region AR1 as a bottom tier, and the first active region AR1 may be provided thereon with the second active region AR2 as a top tier. For example, the substrate 100 may be provided thereon with NMOSFETs of the first active region AR1, and the NMOSFETs may be provided thereon with PMOSFETs of the second active region AR2. The first and second active regions AR1 and AR2 may be spaced apart from each other in a vertical direction or a third direction D3.

The first and second active regions AR1 and AR2 may each have a first width W1 in the first direction D1. A second height HE2 may be defined to indicate a length in the first direction D1 of the single height cell SHC according to an embodiment of the present inventive concept. The second height HE2 of the single height cell SHC may be substantially the same as a distance (e.g., pitch) between the first power line POR1 and the second power line POR2.

Because the single height cell SHC according to an embodiment of the present inventive concept includes a three-dimensional device or a stacked transistor, the first and second active regions AR1 and AR2 may overlap each other. Therefore, the second height HE2 of the single height cell SHC may have a size enough to cover the first width W1. As a result, the second height HE2 of the single height cell SHC according to an embodiment of the present inventive concept may be smaller than the first height HE1 of the single height cell SHC' discussed above in FIG. 1. For example, the single height cell SHC according to an embodiment of the present inventive concept may have a relatively small area. For a three-dimensional semiconductor device according to an embodiment of the present inventive concept, an area of a logic cell may be reduced to increase integration of the device. For example, the single height cell SHC of a three-dimensional semiconductor device according to an embodiment of the present inventive concept may dramatically increase the number of transistors in a package as each area may effectively double the number of total devices in comparison to the single height cell SHC' of a two-dimensional device according to the comparative example.

Figure 3:
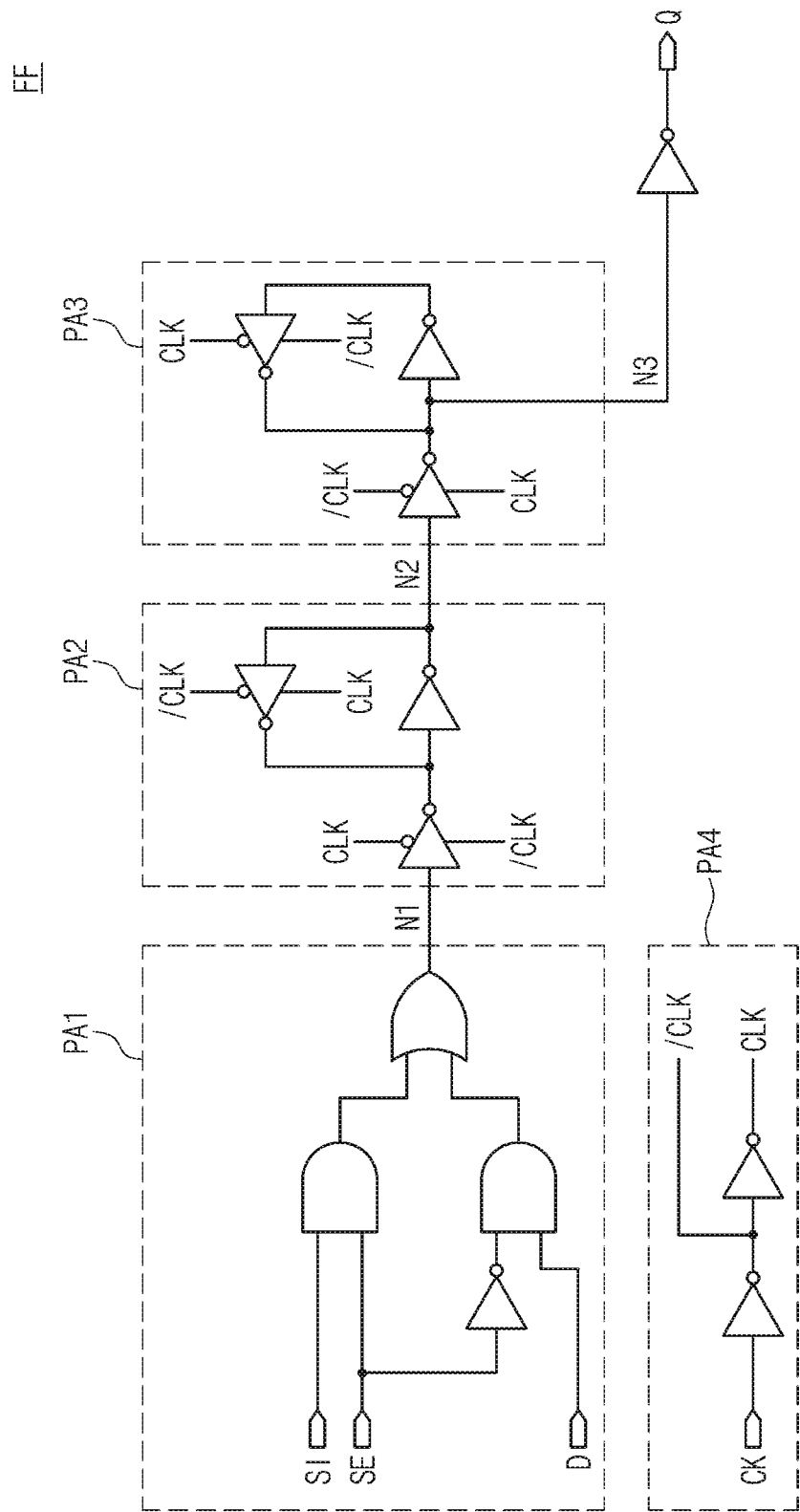
FIG. 3 illustrates a logic circuit diagram showing a flip-flop of a semiconductor device according to an embodiment of the present inventive concept.
Figure 4:
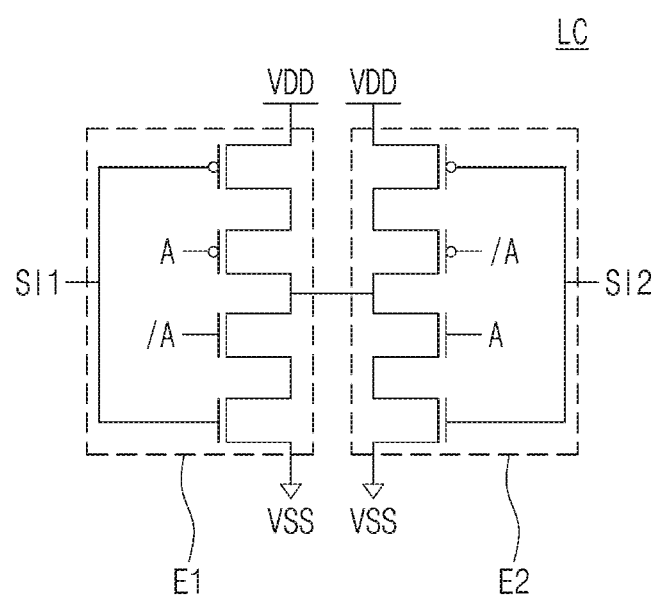
FIG. 4 illustrates a logic circuit that constitutes the flip-flop of FIG. 3.

FIG. 3 illustrates a logic circuit diagram showing a flip-flop of a semiconductor device according to an embodiment of the present inventive concept. FIG. 4 illustrates a logic circuit that constitutes the flip-flop of FIG. 3.

Referring to FIGS. 3 and 4, a flip-flop cell FF may include a logic circuit LC of FIG. 4. For example, the flip-flop cell FF may include first to fourth parts PA1 to PA4. The first part PA1 may be a core circuit that performs a scan function and a flip-flop function. In response to a scan enable signal SE, the first part PA1 may select one of an external input signal D and a scan input signal SI, and based on the selected signal, the first part PA1 may provide a first node N1 with an internal signal. The first part PA1 may be called, for example, a mux, a scan mux, or a selector.

Each of the second and third parts PA2 and PA3 may be a buffer region. The second part PA2 may include a master latch, and the third part PA3 may include a slave latch. A second node N2 may be provided between the second part PA2 and the third part PA3. The master latch of the second part PA2 may latch the internal signal from the first node N1, based on a clock signal CLK. Based on the clock signal CLK, the slave latch of the third part PA3 may latch an output of the master latch and provide an output signal Q. A third node N3 may be connected to the third part PA3. The fourth part PA4 may include a clock circuit that connects to a flip-flop and receives an external clock signal CK.

Referring back to FIGS. 3 and 4, each of the first, second, and third parts PA1, PA2, and PA3 may include a first element E1 to which a first input signal SI1 is input and a second element E2 to which a second input signal SI2 is input. The first and second elements E1 and E2 may be connected to each other.

The first element E1 may include first to fourth transistors that are connected in series. The first to fourth transistors may be sequentially disposed between VDD and VSS terminals. The first and second transistors may be PMOS transistors, and the third and fourth transistors may be NMOS transistors. The first input signal SI1 may be input to the first and fourth transistors, a first signal A may be input to the second transistor, and a second signal /A may be input to the third transistor. The second signal /A may be an inverse signal to the first signal A.

The second element E2 may include first to fourth transistors that are connected in series. The first to fourth transistors may be sequentially disposed between VDD and VSS terminals. The first and second transistors may be PMOS transistors, and the third and fourth transistors may be NMOS transistors. The second input signal SI2 may be input to the first and fourth transistors, a second signal /A may be input to the second transistor, and a first signal A may be input to the third transistor.

As regards the first part PA1, the first signal A may be a scan enable signal SE, and the second signal /A may be a scan enable inverse signal SI. As regards the second and third parts PA2 and PA3, the first signal A may be a clock signal CLK, and the second signal /A may be a clock inverse signal /CLK.

Figure 5:
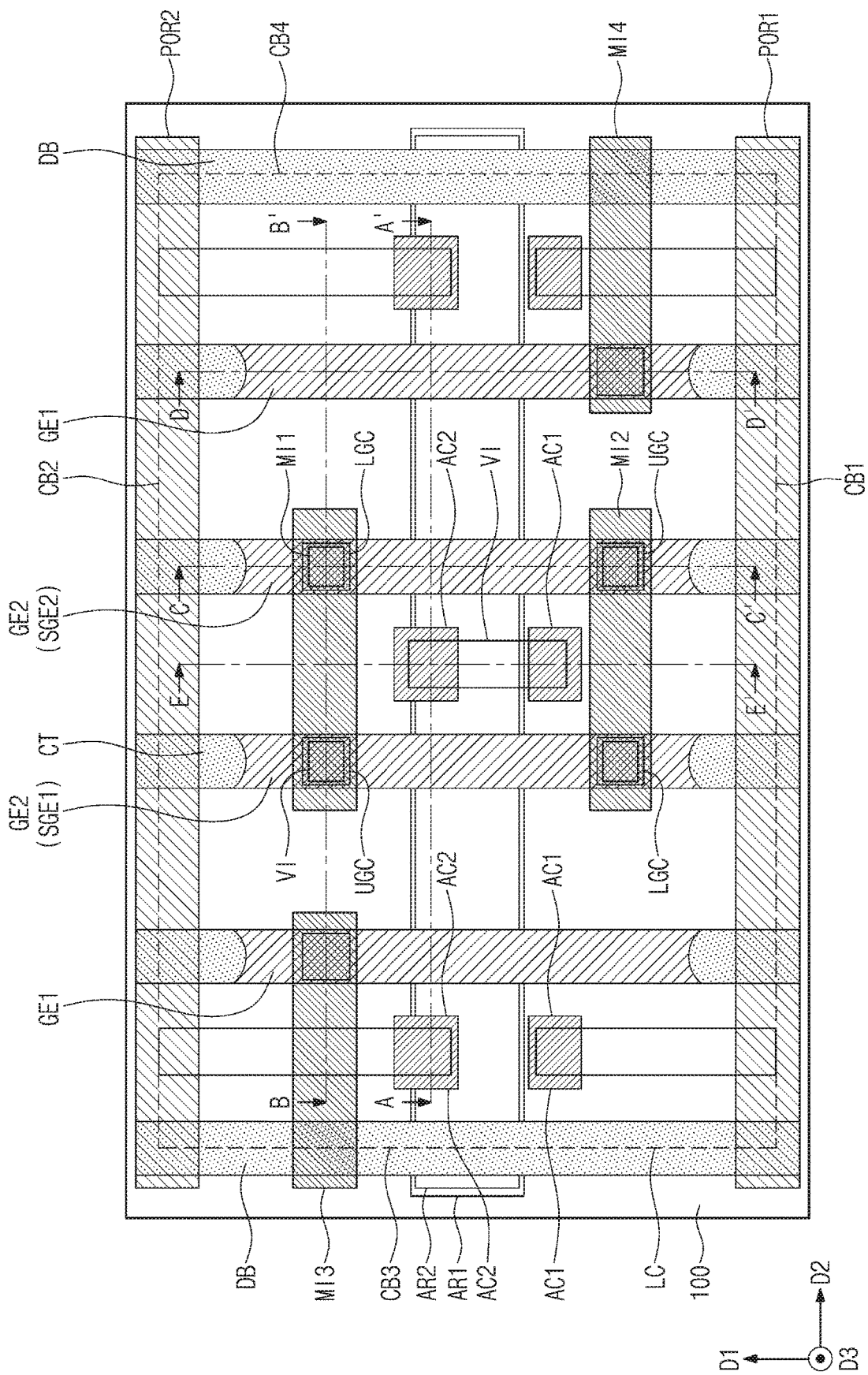
FIG. 5 illustrates a plan view showing a three-dimensional semiconductor device according to an embodiment of the present inventive concept.

FIG. 5 illustrates a plan view showing a three-dimensional semiconductor device according to an embodiment of the present inventive concept. FIGS. 6A, 6B, 6C, 6D, and 6E illustrate cross-sectional views respectively taken along lines A-A', B-B', C-C', D-D', and E-E' of FIG. 5. A three-dimensional device shown in FIGS. 5 and 6A to 6E may indicate a detailed example in which the logic circuit LC of FIG. 4 is implemented in the single height cell SHC of FIG. 2.

Referring to FIGS. 5 and 6A to 6E, a substrate 100 may be provided thereon with a logic cell including the logic circuit LC of FIG. 4. The substrate 100 may be a compound semiconductor substrate or a semiconductor substrate including, for example, silicon (Si), germanium (Ge), or silicon-germanium (SiGe). For example, the substrate 100 may be a silicon substrate. Alternatively, the substrate 100 may include, but is not limited to, SOI (silicon-on-insulator), SGOI (silicon germanium on insulator), indium antimonide (InSb), lead tellurium (PbTe) compounds, indium arsenide (InAs), indium phosphide (InP), gallium arsenide (GaAs), gallium phosphide (GaP), or gallium antimonide (GaSb). Also, the substrate 100 may include one or more semiconductor layers or structures and may include active or operable portions of semiconductor devices.

The logic cell may include a first active region AR1 and a second active region AR2 that are sequentially stacked on the substrate 100. One of the first and second active regions AR1 and AR2 may be a PMOSFET region, and the other of the first and second active regions AR1 and AR2 may be an NMOSFET region. The first active region AR1 may be provided on a bottom tier of a front-end-of-line (FEOL) layer, and the second active region AR2 may be provided on a top tier of a front-end-of-line (FEOL) layer. NMOS and PMOS field effect transistors of the first and second active regions AR1 and AR2 may be vertically stacked to constitute three-dimensionally stacked transistors. In an embodiment of the present inventive concept, the first active region AR1 may be an NMOSFET region, and the second active region AR2 may be a PMOSFET region.

The NMOS and PMOS field effect transistors of the first and second active regions AR1 and AR2 may include the first to fourth transistors that constitute the logic circuit LC of FIG. 4. When viewed in plan, the stacked first and second active regions AR1 and AR2 may be positioned between a first power line POR1 and a second power line POR2. For example, the first power line POR1, the stacked first and second active regions AR1 and AR2, and the second power line POR2 may be sequentially arranged in the first direction D1.

An active pattern AP may be defined by a trench TR formed on an upper portion of the substrate 100. The active pattern AP may be a vertically protruding portion of the substrate 100. When viewed in plan, the active pattern AP may have a bar shape that extends in a second direction D2. The active pattern AP may be provided thereon with the first and second active regions AR1 and AR2 that are sequentially stacked.

The trench TR may be filled with a device isolation layer ST. For example, the device isolation layer ST may be formed on the substrate 100 to define the active pattern AP. The device isolation layer ST may include a silicon oxide (SiO₂) layer, and may have a top surface at a level the same as or lower than that of a top surface of the active pattern AP. The device isolation layer ST may not cover any of lower and upper channel patterns CH1 and CH2 which will be discussed below.

Figure 6A:
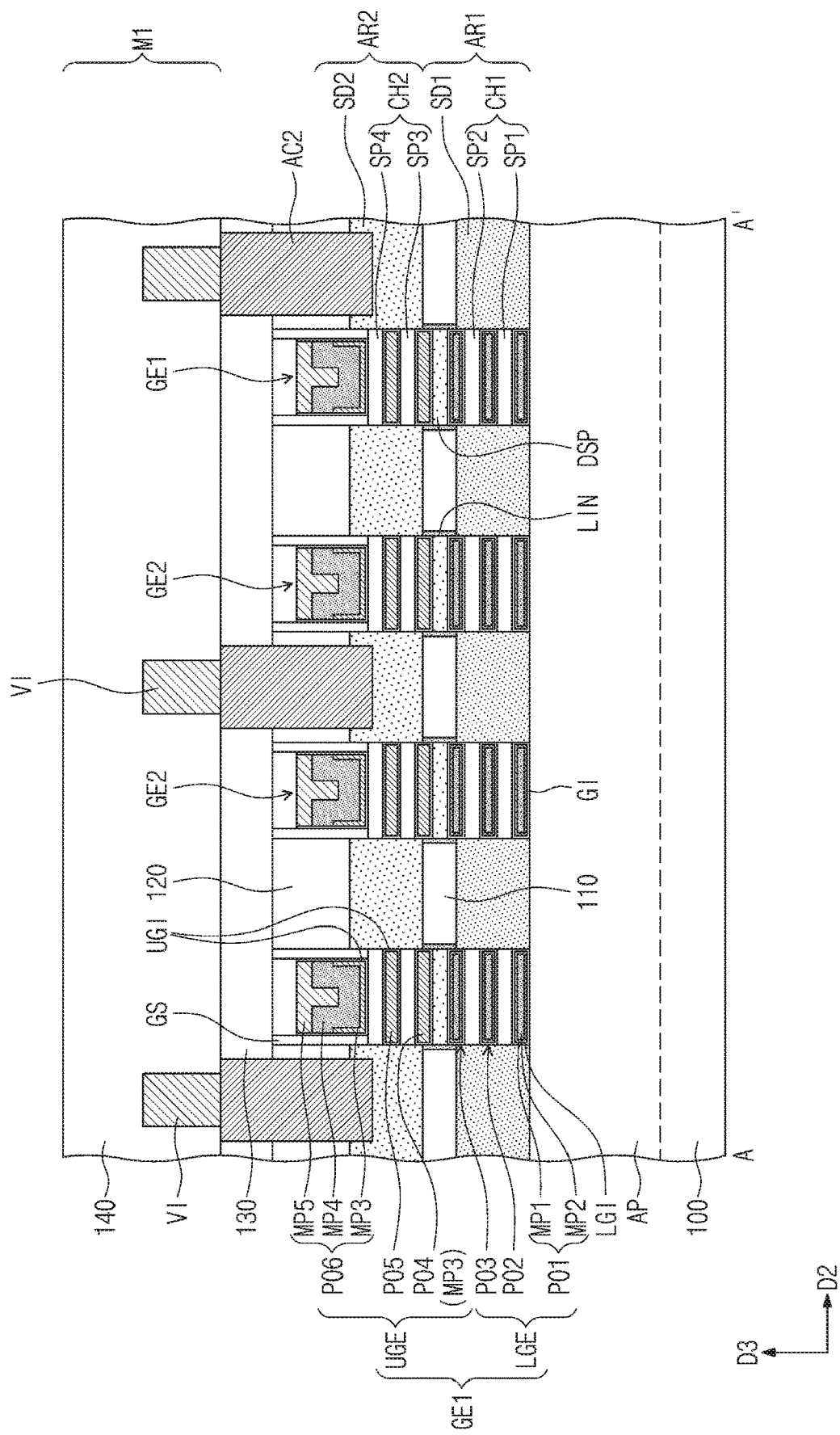
FIGS. 6A, 6B, 6C, 6D, and 6E illustrate cross-sectional views respectively taken along lines A-A', B-B', C-C', D-D', and E-E' of FIG. 5.

The active pattern AP may be provided thereon with the first active region AR1 that includes lower channel patterns CH1 and lower source/drain patterns SD1. Each of the lower channel patterns CH1 may be interposed between a pair of the lower source/drain patterns SD1. The lower channel pattern CH1 may connect a pair of lower source/drain patterns SD1 to each other. Referring to FIG. 6A, the first active region AR1 may include a plurality of lower channel patterns CH1 and a plurality of lower source/drain patterns SD1 that are alternately arranged along the second direction D2.

The lower channel pattern CH1 may include a first semiconductor pattern SP1 and a second semiconductor pattern SP2 that are sequentially stacked. The first and second semiconductor patterns SP1 and SP2 may be spaced apart from each other in a vertical direction (or a third direction D3). Each of the first and second semiconductor patterns SP1 and SP2 may include, for example, silicon (Si), germanium (Ge), or silicon-germanium (SiGe). In an embodiment of the present inventive concept, each of the first and second semiconductor patterns SP1 and SP2 may include crystalline silicon (c-Si).

The lower source/drain patterns SD1 may be provided on a top surface of the active pattern AP. Each of the lower source/drain patterns SD1 may be an epitaxial pattern formed by a selective epitaxial growth (SEG) process. For example, the lower source/drain pattern SD1 may have a top surface higher than that of the second semiconductor pattern SP2 included in the lower channel pattern CH1. For example, each pair of the lower source/drain patterns SD1 may be connected to each other by the stacked first and second semiconductor patterns SP1 and SP2 of the lower channel pattern CH1.

The lower source/drain patterns SD1 may be doped with impurities to have a first conductivity type. The first conductivity type may be an n-type or p-type. In an embodiment of the present inventive concept, the first conductivity type may be an n-type. The lower source/drain patterns SD1 may include one or more selected from, for example, silicon (Si) and silicon-germanium (SiGe). The lower source/drain patterns SD1 may include n-type dopants such as, for example, phosphorus (P), arsenic (As), antimony (Sb) and/or bismuth (Bi).

A first interlayer dielectric layer 110 may be provided on the lower source/drain patterns SD1, and may cover the lower source/drain patterns SD1. The first interlayer dielectric layer 110 may be provided thereon with a second interlayer dielectric layer 120 and the second active region AR2.

The second active region AR2 may include upper channel patterns CH2 and upper source/drain patterns SD2. The upper channel patterns CH2 may vertically overlap corresponding lower channel patterns CH1. The upper source/drain patterns SD2 may vertically overlap corresponding lower source/drain patterns SD1. Each of the upper channel patterns CH2 may be interposed between a pair of the upper source/drain patterns SD2. The upper channel pattern CH2 may connect a pair of upper source/drain patterns SD2 to each other. For example, the second active region AR2 may include a plurality of upper channel patterns CH2 and a plurality of upper source/drain patterns SD2 that are alternately arranged along the second direction D2.

The upper channel pattern CH2 may include a third semiconductor pattern SP3 and a fourth semiconductor pattern SP4 that are sequentially stacked. The third and fourth semiconductor patterns SP3 and SP4 may be spaced apart from each other in the third direction D3. The third and fourth semiconductor patterns SP3 and SP4 included in the upper channel pattern CH2 may have a material the same as that of the first and second semiconductor patterns SP1 and SP2 included in the lower channel pattern CH1.

At least one dummy channel pattern DSP may be interposed between the lower channel pattern CH1 and the upper channel pattern CH2 that overlies the lower channel pattern CH1. The dummy channel pattern DSP may be spaced apart from the lower source/drain patterns SD1. Also, the dummy channel pattern DSP may be spaced apart from the upper source/drain patterns SD2. For example, the dummy channel pattern DSP may not be connected to any of source/drain patterns. The dummy channel pattern DSP may include a semiconductor material such as, for example, silicon (Si), germanium (Ge), or silicon-germanium (SiGe), or a dielectric material such as, for example, silicon oxide (SiO₂) or silicon nitride (Si₃N4).

The upper source/drain patterns SD2 may be provided on a top surface of the first interlayer dielectric layer 110. Each of the upper source/drain patterns SD2 may be an epitaxial pattern formed by a selective epitaxial growth (SEG) process. For example, the upper source/drain pattern SD2 may have a top surface higher than that of the fourth semiconductor pattern SP4 included in the upper channel pattern CH2. For example, each pair of the upper source/drain pattern SD2 may be connected to each other by the stacked third and fourth semiconductor patterns SP3 and SP4 of the upper channel pattern CH2.

The upper source/drain patterns SD2 may be doped with impurities to have a second conductivity type. The second conductivity type may be different from the first conductivity type of the lower source/drain patterns SD1. The second conductivity type may be a p-type. The upper source/drain patterns SD2 may include one or more selected from, for example, silicon (Si) and silicon-germanium (SiGe). The upper source/drain patterns SD2 may include p-type dopants such as, for example, boron (B), aluminum (Al), gallium (Ga), and/or indium (In).

The second interlayer dielectric layer 120 may cover the upper source/drain patterns SD2. The second interlayer dielectric layer 120 may have a top surface coplanar with that of a gate capping pattern GP which will be discussed below.

A gate electrode GE may be provided on the stacked lower and upper channel patterns CH1 and CH2. When viewed in plan, the gate electrode GE may have a bar shape that extends in the first direction D1. A plurality of gate electrodes GE may be provided on the substrate 100, and the plurality of gate electrodes GE may be arranged at a first pitch along the second direction D2. Each of the gate electrodes GE may vertically overlap the stacked lower and upper channel patterns CH1 and CH2.

The plurality of gate electrodes GE on the logic circuit LC according to an embodiment of the present inventive concept may include first gate electrodes GE1 and second gate electrodes GE2. The second gate electrodes GE2 may be disposed between the first gate electrodes GE1. Each of the first gate electrodes GE1 may be a common gate electrode in which a lower gate electrode LGE and an upper gate electrode UGE are connected to each other. Each of the second gate electrodes GE2 may be a split gate electrode in which a lower gate electrode LGE and an upper gate electrode UGE are separated from each other.

Figure 6B:
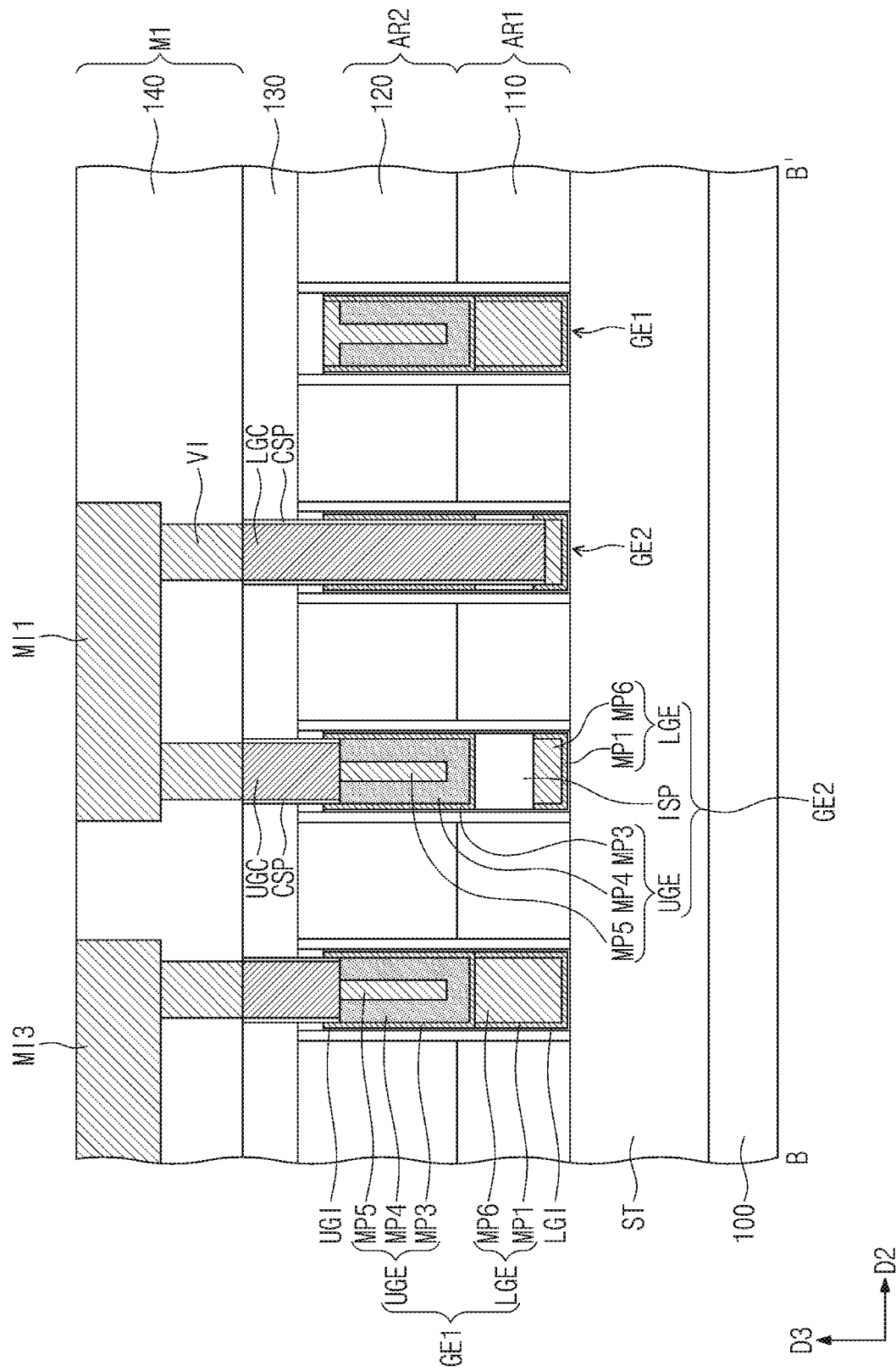

The first gate electrode GE1 will be further discussed in detail with reference to FIGS. 6A, 6B, and 6D. The first gate electrode GE1 may extend in a vertical direction (or the third direction D3) from a top surface of the device isolation layer ST (or of the active pattern AP) to a gate capping pattern GP which will be discussed below. The first gate electrode GE1 may extend in the third direction D3 from the lower channel pattern CH1 of the first active region AR1 to the upper channel pattern CH2 of the second active region AR2. The first gate electrode GE1 may extend in the third direction D3 from the first semiconductor pattern SP1 to the fourth semiconductor pattern SP4. In an embodiment of the present inventive concept, the first gate electrode GE1 may be disposed on a first lower channel pattern of the lower channel patterns CH1 and on a first upper channel pattern of the upper channel patterns CH2, and the second gate electrode GE2 may be disposed on a second lower channel pattern of the lower channel patterns CH1 and on a second upper channel pattern of the upper channel patterns CH2.

The first gate electrode GE1 may be provided on a top surface, a bottom surface, and opposite sidewalls of each of the first to fourth semiconductor patterns SP1 to SP4. In this sense, a transistor according to an embodiment of the present inventive concept may be a three-dimensional field effect transistor (e.g., multi-bridge channel field effect transistor (MBCFET) or gate all around field effect transistor (GAAFET)) in which the first gate electrode GE1 three-dimensionally surrounds a channel The first gate electrode GE1 may include a lower gate electrode LGE provided on a bottom tier of a front-end-of-line (FEOL) layer or on the first active region AR1, and may also include an upper gate electrode UGE provided on a top tier of a front-end-of-line (FEOL) layer or on the second active region AR2. The lower and upper gate electrodes LGE and UGE may vertically overlap each other. The lower and upper gate electrodes LGE and UGE of the first gate electrode GE1 may be connected to each other. For example, the first gate electrode GE1 may be a common gate electrode in which the lower gate electrode LGE of the first active region AR1 is connected to the upper gate electrode UGE of the second active region AR2.

The lower gate electrode LGE of the first gate electrode GE1 may include a first portion PO1 interposed between the active pattern AP and the first semiconductor pattern SP1, a second portion PO2 interposed between the first semiconductor pattern SP1 and the second semiconductor pattern SP2, and a third portion PO3 interposed between the second semiconductor pattern SP2 and the dummy channel pattern DSP.

The upper gate electrode UGE of the first gate electrode GE1 may include a fourth portion PO4 interposed between the dummy channel pattern DSP and the third semiconductor pattern SP3, a fifth portion PO5 interposed between the third semiconductor pattern SP3 and the fourth semiconductor pattern SP4, and a sixth portion PO6 on the fourth semiconductor pattern SP4.

A pair of gate spacers GS may be disposed on opposite sidewalls of the first gate electrodes GE1. Referring to FIG. 6A, a pair of gate spacers GS may be disposed on opposite sidewalls of the sixth portion PO6. The gate spacers GS may extend in the first direction D1 along the first gate electrode GE1, and may have their top surfaces higher than that of the first gate electrode GE1. The top surfaces of the gate spacers GS may be coplanar with that of the second interlayer dielectric layer 120. The gate spacers GS may include one or more selected from, for example, silicon carbonitride (SiCN), silicon carbon oxynitride (SiCON), and silicon nitride ($Si_3N_4$). Alternatively, the gate spacers GS may each include multiple layers formed of two or more selected from, for example, a silicon carbonitride (SiCN) layer, a silicon carbon oxynitride (SiCON) layer, and a silicon nitride ($Si_3N_4$) layer. A pair of liner layers LIN may be provided on opposite sidewalls of each of the third and fourth portions PO3 and PO4 of the first gate electrode GE1.

A gate capping pattern GP may be provided on the top surface of the first gate electrode GE1. The gate capping pattern GP may extend in the first direction D1 along the first gate electrode GE1. For example, the gate capping pattern GP may include one or more selected from, for example, silicon oxynitride (SiON), silicon carbonitride (SiCN), silicon carbon oxynitride (SiCON), and silicon nitride ($Si_3N_4$).

Gate dielectric layers UGI and LGI may be interposed between the first gat electrode GE1 and the first to fourth semiconductor patterns SP1 to SP4. For example, a lower gate dielectric layer LGI may be interposed between the lower gate electrode LGE and each of the first and second semiconductor patterns SP1 and SP2. An upper gate dielectric layer UGI may be interposed between the upper gate electrode UGE and each of the third and fourth semiconductor patterns SP3 and SP4.

Each of the lower and upper gate dielectric layers LGI and UGI may include one or more selected from, for example, a silicon oxide ($SiO_2$) layer, a silicon oxynitride (SiON) layer, and a high-k dielectric layer. In an embodiment of the present inventive concept, each of the lower and upper gate dielectric layers LGI and UGI may include a silicon oxide ($SiO_2$) layer that directly covers a corresponding one of the first to fourth semiconductor patterns SP1 to SP4, and may also include a high-k dielectric layer on the silicon oxide ($SiO_2$) layer. For example, each of the lower and upper gate dielectric layers LGI and UGI may include multiple layers.

The high-k dielectric layer may include a high-k dielectric material whose dielectric constant is greater than that of a silicon oxide ($SiO_2$) layer. For example, the high-k dielectric material may include one or more selected from, for example, hafnium oxide ($HfO_2$), hafnium silicon oxide ($HfSiO_4$), hafnium zirconium oxide ($HfZrO_4$), hafnium tantalum oxide ($Hf_2Ta_2O_9$), hafnium aluminum oxide (HfAlO$_3$), lanthanum oxide (La$_2$O$_3$), lanthanum aluminum oxide (LaAlO$_3$), zirconium oxide (ZrO$_2$), zirconium silicon oxide (ZrSiO$_4$), tantalum oxide (Ta$_2$O$_5$), titanium oxide (TiO$_2$), barium strontium titanium oxide (BaSrTi$_2$O$_6$), barium titanium oxide (BaTiO$_3$), strontium titanium oxide (SrTiO$_3$), lithium oxide (Li$_2$O), aluminum oxide (Al$_2$O$_3$), lead scandium tantalum oxide (Pb(Sc,Ta)O$_3$), and lead zinc niobate [Pb(Zn$_{1/3}$Nb$_{2/3}$)O$_3$].

In an embodiment of the present inventive concept, the lower gate dielectric layer LGI may include a first dipole element. The first dipole element may include, for example, lanthanum (La), aluminum (Al), or a combination thereof. For example, lanthanum (La), aluminum (Al), or a combination thereof may be contained as impurities in the lower gate dielectric layer LGI. The lower gate dielectric layer LGI may include a dipole-interface that the first dipole element creates between the high-k dielectric layer and the silicon oxide (SiO$_2$) layer.

When the lower gate dielectric layer LGI contains lanthanum (La), there may be a reduction in work function of the lower gate electrode LGE. Consequently, there may be a reduction in threshold voltage of a transistor (e.g., NMOS transistor) on the first active region AR1. Alternatively, when the lower gate dielectric layer LGI contains aluminum (Al), there may be an increase in effective work function of the lower gate electrode LGE. Accordingly, there may be an increase in threshold voltage of a transistor (e.g., NMOS transistor) on the first active region AR1. For example, the threshold voltage of the NMOS transistor may be adjusted by incorporating a predetermined amount of the first dipole element such as, for example, lanthanum (La), aluminum (Al), or a combination thereof into the lower gate dielectric layer LGI.

In an embodiment of the present inventive concept, the upper gate dielectric layer UGI may include no dipole element. For example, a maximum concentration of a dipole element in the upper gate dielectric layer UGI may be smaller than that of the first dipole element in the lower gate dielectric layer LGI. In an embodiment of the present inventive concept, the upper gate dielectric layer UGI may include a second dipole element. The second dipole element may be the same as or different from the first dipole element.

The lower gate electrode LGE of the first gate electrode GE1 may include a first metal pattern MP1 on the first and second semiconductor patterns SP1 and SP2, and may also include a second metal pattern MP2 on the first metal pattern MP1. The first metal pattern MP1 may include a first work-function metal, and the second metal pattern MP2 may include a second work-function metal. A composition of the first work-function metal and the second work-function metal may be adjusted to achieve a threshold voltage of a transistor on the first active region AR1.

The first work-function metal of the first metal pattern MP1 may be a p-type work-function metal whose work function is relatively high. The first metal pattern MP1 may include a metal nitride layer. The first metal pattern MP1 may include nitrogen (N) and at least one selected from metals such as, for example, titanium (Ti), tantalum (Ta), aluminum (Al), tungsten (W), and molybdenum (Mo). For example, the first metal pattern MP1 may include, for example, titanium nitride (TiN), tantalum nitride (TaN), titanium oxynitride (TiON), titanium silicon nitride (TiSiN), titanium aluminum nitride (TiAlN), tungsten carbon nitride (WCN), or molybdenum nitride (MoN).

The second work-function metal of the second metal pattern MP2 may be an n-type work-function metal whose work function is relatively low. The second metal pattern MP2 may include metal carbide. The second metal pattern MP2 may include metal carbide doped with (or containing) one or more selected from, for example, silicon (Si) and aluminum (Al). In an embodiment of the present inventive concept, the second metal pattern MP2 may include, for example, aluminum-doped titanium carbide (TiAlC), aluminum-doped tantalum carbide (TaAlC), aluminum-doped vanadium carbide (VAlC), silicon-doped titanium carbide (TiSiC), or silicon-doped tantalum carbide (TaSiC). In an embodiment of the present inventive concept, the second metal pattern MP2 may include, for example, aluminum-silicon-doped titanium carbide (TiAlSiC) or aluminum-silicon-doped tantalum carbide (TaAlSiC). In an embodiment of the present inventive concept, the second metal pattern MP2 may include, for example, aluminum-doped titanium (TiAl). In an embodiment of the present inventive concept, the second metal pattern MP2 may include metal nitride doped with one or more selected from, for example, silicon and aluminum, such as aluminum-doped titanium nitride (TiAlN).

The work-function of the second metal pattern MP2 may be controlled by adjusting a concentration of dopants (or impurities) such as silicon or aluminum. For example, impurities (e.g., silicon (Si) or aluminum (Al)) in the second metal pattern MP2 may have a concentration ranging from about 0.1 at % to about 25 at %. The term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Each of the first, second, and third portions PO1, PO2, and PO3 included in the lower gate electrode LGE may include a second metal pattern MP2 and a first metal pattern MP1 that surrounds a circumference of the second metal pattern MP2. For example, the second metal pattern MP2 may have a thickness greater than that of the first metal pattern MP1. By adjusting the first work function of the first metal pattern MP1 and the second work function of the second metal pattern MP2 included in the first, second, and third portions PO1, PO2, and PO3 which are interposed among the active pattern AP, the first semiconductor pattern SP1, the second semiconductor pattern SP2 and the dummy channel pattern DSP, an operating threshold voltage of a transistor on the first active region AR1 with good distribution may be achieved. For example, by properly adjusting the work function of the lower gate electrode LGE around the lower channel pattern CH1, a threshold voltage suitable for a transistor on the first active region AR1 may be achieved.

Figure 6C:
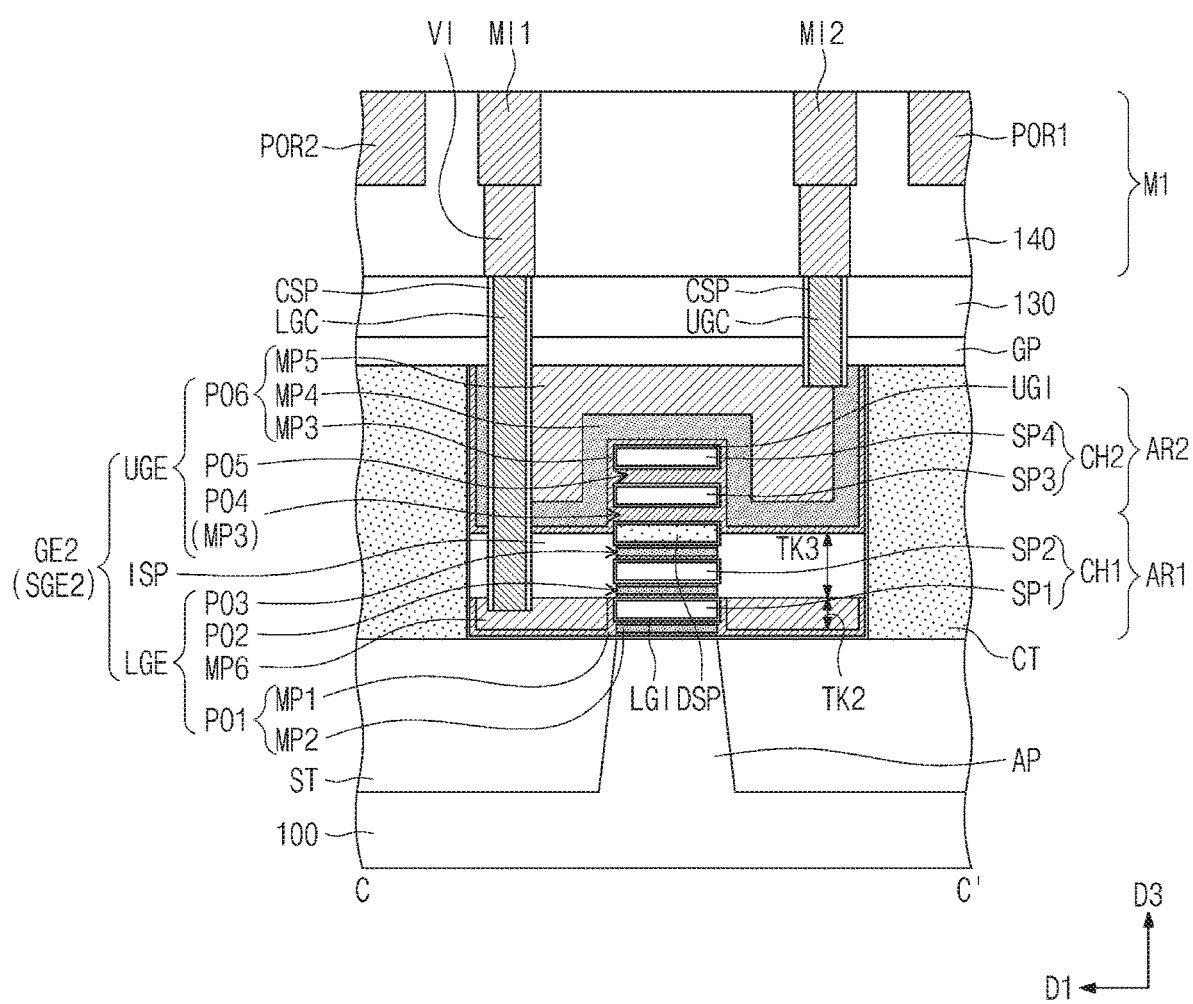
Figure 6D:
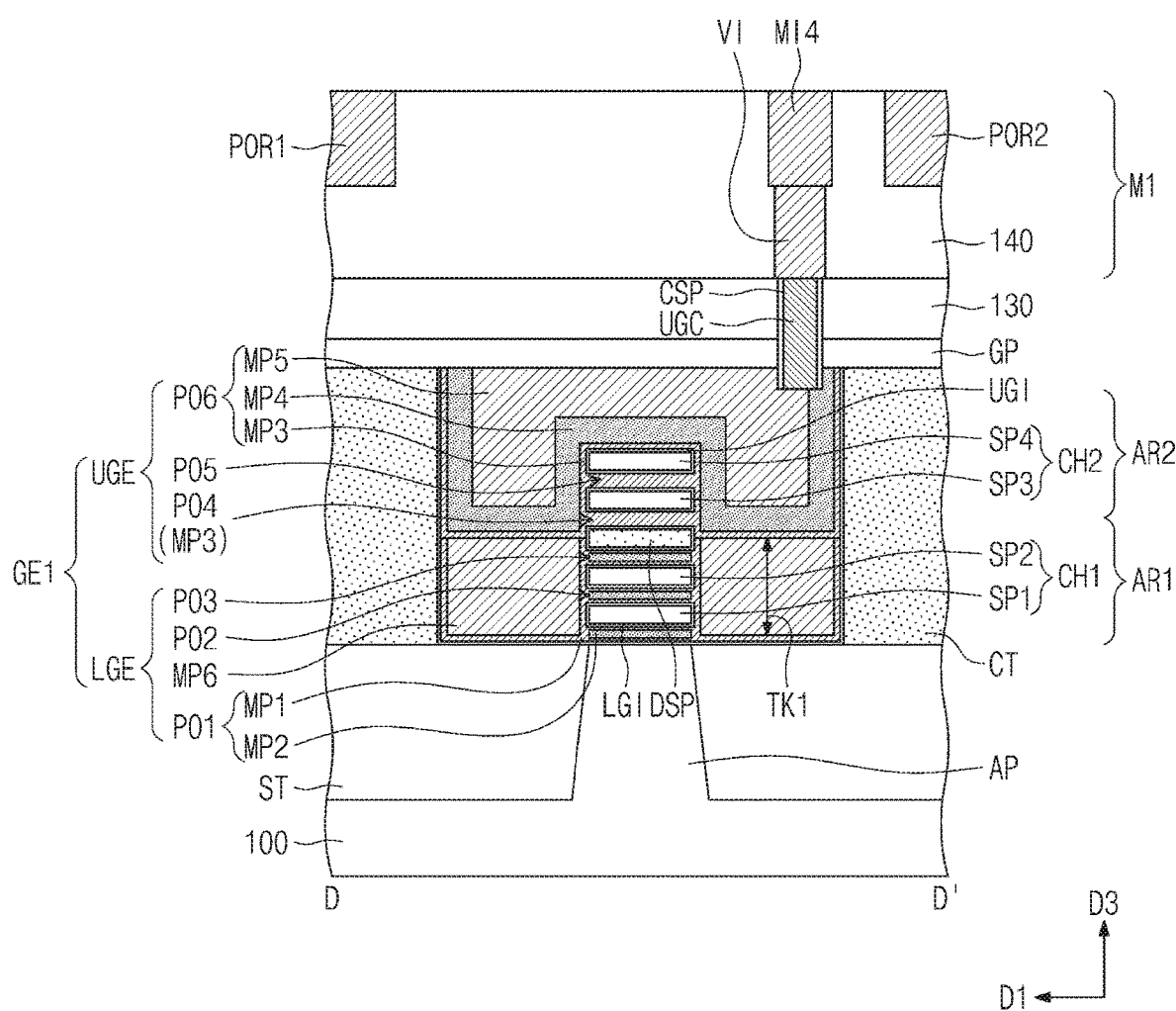

The lower gate electrode LGE may further include a sixth metal pattern MP6 at its remaining portion other than the first, second, and third portions PO1, PO2, and PO3 (see FIG. 6D). The sixth metal pattern MP6 may have resistance lower than those of the first and second metal patterns MP1 and MP2. For example, the sixth metal pattern MP6 may include at least one selected from metals, whose resistances are low, such as, for example, tungsten (W), ruthenium (Ru), aluminum (Al), titanium (Ti), and tantalum (Ta).

Referring to FIG. 6D, the sixth metal pattern MP6 of the first gate electrode GE1 may have a top surface in contact with a bottom surface of the upper gate electrode UGE. The top surface of the sixth metal pattern MP6 may be located at a level between those of top and bottom surfaces of the dummy channel pattern DSP. The sixth metal pattern MP6 may have a first thickness TK1 in the third direction D3.

The upper gate electrode UGE of the first gate electrode GE1 may include a third metal pattern MP3 on the third and fourth semiconductor patterns SP3 and SP4. The third metal pattern MP3 may surround the third and fourth semiconductor patterns SP3 and SP4. The upper gate electrode UGE may further include a fourth metal pattern MP4 and a fifth metal pattern MP5 on the third metal pattern MP3.

The third metal pattern MP3 may include the first work-function metal, and the fourth metal pattern MP4 may include the second work-function metal. A composition of the first work-function metal and the second work-function metal may be adjusted to achieve a threshold voltage of a transistor on the second active region AR2.

Similar to the first metal pattern MP1, the first work-function metal of the third metal pattern MP3 may be a p-type work-function metal whose work function is relatively high. The third metal pattern MP3 may include a metal nitride layer. The metal nitride layer of the third metal pattern MP3 may be the same as or different from that of the first metal pattern MP1.

Similar to the second metal pattern MP2, the second work-function metal of the fourth metal pattern MP4 may be an n-type work-function metal whose work function is relatively low. The fourth metal pattern MP4 may include metal carbide doped with (or containing) one or more selected from, for example, silicon (Si) and aluminum (Al). The fourth metal pattern MP4 may include a material the same as or different from that of the second metal pattern MP2.

The fourth and fifth portions PO4 and PO5 of the upper gate electrode UGE may be formed of a third metal pattern MP3. The sixth portion PO6 of the upper gate electrode UGE may include a third metal pattern MP3, a fourth metal pattern MP4, and a fifth metal pattern MP5 that are sequentially stacked.

In an embodiment of the present inventive concept, the fifth metal pattern MP5 may include the first work-function metal. For example, the fifth metal pattern MP5 may include the same metal nitride layer as that of the third metal pattern MP3. In an embodiment of the present inventive concept, the fifth metal pattern MP5 may include metal whose resistance is low. For example, the fifth metal pattern MP5 may include a metal the same as that of the sixth metal pattern MP6.

The second gate electrode GE2 will be further discussed in detail with reference to FIGS. 6A, 6B, and 6C. In the description of the second gate electrode GE2, the discussion of features the same as those in the first gate electrode GE1 is omitted in order to avoid repetition and differences thereof will be mainly described.

The second gate electrode GE2 may include a lower gate electrode LGE provided in the first active region AR1 and an upper gate electrode UGE provided in the second active region AR2. An isolation pattern ISP may be interposed between the lower and upper gate electrodes LGE and UGE of the second gate electrode GE2. The isolation pattern ISP may cause the second gate electrode GE2 to become a split gat electrode in which the lower gate electrode LGE of the first active region AR1 is separated from the upper gate electrode UGE of the second active region AR2. In an embodiment of the present inventive concept, the first gate electrode GE1 may include a first lower gate electrode of the lower gate electrodes LGE on the first lower channel pattern of the lower channel patterns CH1, and a first upper gate electrode of upper gate electrodes UGE on the first upper channel pattern of the upper channel patterns CH2, in which the first lower gate electrode and the first upper gate electrode are connected to each other. The second gate electrode may include a second lower gate electrode of the lower gate electrodes LGE on the second lower channel pattern of the lower channel patterns CH1, a second upper gate electrode of the upper gate electrodes UGE on the second upper channel pattern of the upper channel patterns CH2, and an isolation pattern ISP between the second lower gate electrode and the second upper gate electrode, in which the second lower gate electrode and the second upper gate electrode are separated from each other by the isolation pattern ISP. In an embodiment of the present inventive concept, each of the first and second lower gate electrodes may surround the first and second semiconductor patterns SP1 and SP2, and each of the first and second upper gate electrodes may surround the third and fourth semiconductor patterns SP3 and SP4.

Identical to the first, second, and third portions PO1, PO2, and PO3 of the first gate electrode GE1, each of the first, second, and third portions PO1, PO2, and PO3 of the second gate electrode GE2 may include first and second metal patterns MP1 and MP2. The lower gate electrode LGE of the second gate electrode GE2 may be recessed at a remaining portion other than the first, second, and third portions PO1, PO2, and PO3. The isolation pattern ISP may fill the recessed region of the lower gate electrode LGE.

Referring to FIG. 6C, the sixth metal pattern MP6 of the second gate electrode GE2 may have a top surface in contact with a bottom surface of the isolation pattern ISP. The isolation pattern ISP may have a top surface in contact with a bottom surface of the upper gate electrode UGE. The top surface of the isolation pattern ISP may be located at a level between levels of top and bottom surfaces of the dummy channel pattern DSP. The top surface of the sixth metal pattern MP6 may be located at a level between that of a top surface of the first semiconductor pattern SP1 and that of a bottom surface of the second semiconductor pattern SP2.

The sixth metal pattern MP6 may have a second thickness TK2 in the third direction D3. The isolation pattern ISP may have a third thickness TK3 in the third direction D3. Each of the second and third thicknesses TK2 and TK3 may be smaller than the first thickness TK1 of FIG. 6D. For example, a sum of the second and third thicknesses TK2 and TK3 may be substantially the same as the first thickness TK1. In an embodiment of the present inventive concept, the third thickness TK3 may be greater than the second thickness TK2.

Because there is a separation between the lower and upper gate electrodes LGE and UGE of the second gate electrode GE2, a signal may be individually applied to each of the lower and upper gate electrodes LGE and UGE. Therefore, as discussed below, the second gate electrode GE2 may be provided with a lower gate contact LGC connected to the lower gate electrode LGE and with an upper gate contact UGC connected to the upper gate electrode UGE. Since the lower gate contact LGC and the upper gate contact UGC may be formed to have different depths from each other, and may be correspondingly connected to the lower gate electrode LGE and the upper gate electrode UGC, a cross-couple structure may be achieved with this configuration. As a result, according to an embodiment of the present inventive concept, a semiconductor device may increase in integration.

Referring back to FIG. 5, a first cell boundary CB1 may be defined to extend in the second direction D2 on the logic cell of the logic circuit LC according to an embodiment of the present inventive concept. On a location opposite to that of the first cell boundary CB1, a second cell boundary CB2 may be defined to extend in the second direction D2. Gate cutting patterns CT may be disposed on the first and second cell boundaries CB1 and CB2, and arranged in the second direction D2. When viewed in plan, the gate cutting patterns CT may be arranged at a first pitch along the first cell boundary CBE The gate cutting patterns CT may be arranged at the first pitch along the second cell boundary CB2. When viewed in plan, the gate cutting patterns CT on the first and second cell boundaries CB1 and CB2 may be disposed to correspondingly overlap the first and second gate electrodes GE1 and GE2. For example, the portions of the first and second gate electrodes GE1 and GE2 overlapped by the gate cutting patterns CT may be removed and replaced with the gate cutting patterns CT (see FIGS. 5 and 6D).

The gate cutting pattern CT may penetrate the first gate electrode GE1 or the second gate electrode GE2. The gate cutting pattern CT may separate the first gate electrode GE1 or the second gate electrode GE2 from another gate electrode that is adjacent in the first direction D1. That is, the gate cutting pattern CT may cut one gate electrode into two gate electrodes. For example, referring to FIG. 6D, a pair of gate cutting patterns CT may be provided on opposite ends of the first gate electrode GE1. The gate cutting patterns CT may include a dielectric material, such as, for example, a silicon oxide ($SiO_2$) layer, a silicon nitride ($Si_3N_4$) layer, or a combination thereof.

A third cell boundary CB3 may be defined to extend in the first direction D1 on the logic cell of the logic circuit LC according to an embodiment of the present inventive concept. A fourth cell boundary CB4 may be defined to extend in the first direction D1 on a location opposite to that of the third cell boundary CB3. Cell isolation patterns DB may be correspondingly disposed on the third and fourth cell boundaries CB3 and CB4. Accordingly, the pair of cell isolation patterns DB, which are opposite to each other in the second direction D2, may be parallel to the first and second gate electrodes GE1 and GE2, and may be provided at both sides of the logic cell of FIG. 5. The cell isolation patterns DB may separate the logic cell of FIG. 5 from an adjacent another logic cell, while extending in the first direction D1.

Gate contacts UGC and LGC may be provided to penetrate a following described fourth interlayer dielectric layer 140 and the gate capping pattern GP and to electrically connect to the first and second gate electrodes GE1 and GE2. For example, an upper gate contact UGC may be coupled to the upper gate electrode UGE of each of the first and second gate electrodes GE1 and GE2. A lower gate contact LGC may be coupled to the lower gate electrode LGE of the second gate electrode GE2. For example, a bottom surface of the lower gate contact LGC may be lower than that of the upper gate contact UGC.

Each of the upper and lower gate contacts UGC and LGC may include at least one selected from metals such as, for example, copper (Cu), aluminum (Al), ruthenium (Ru), cobalt (Co), tungsten (W), and molybdenum (Mo). Each of the upper and lower gate contacts UGC and LGC may have a pillar shape that extends in the third direction D3. A contact spacer CSP may be provided to surround an outer sidewall of each of the upper and lower gate contacts UGC and LGC. The contact spacer CSP on the lower gate contact LGC may insulate the lower gate contact LGC from the upper gate electrode UGE.

Figure 6E:
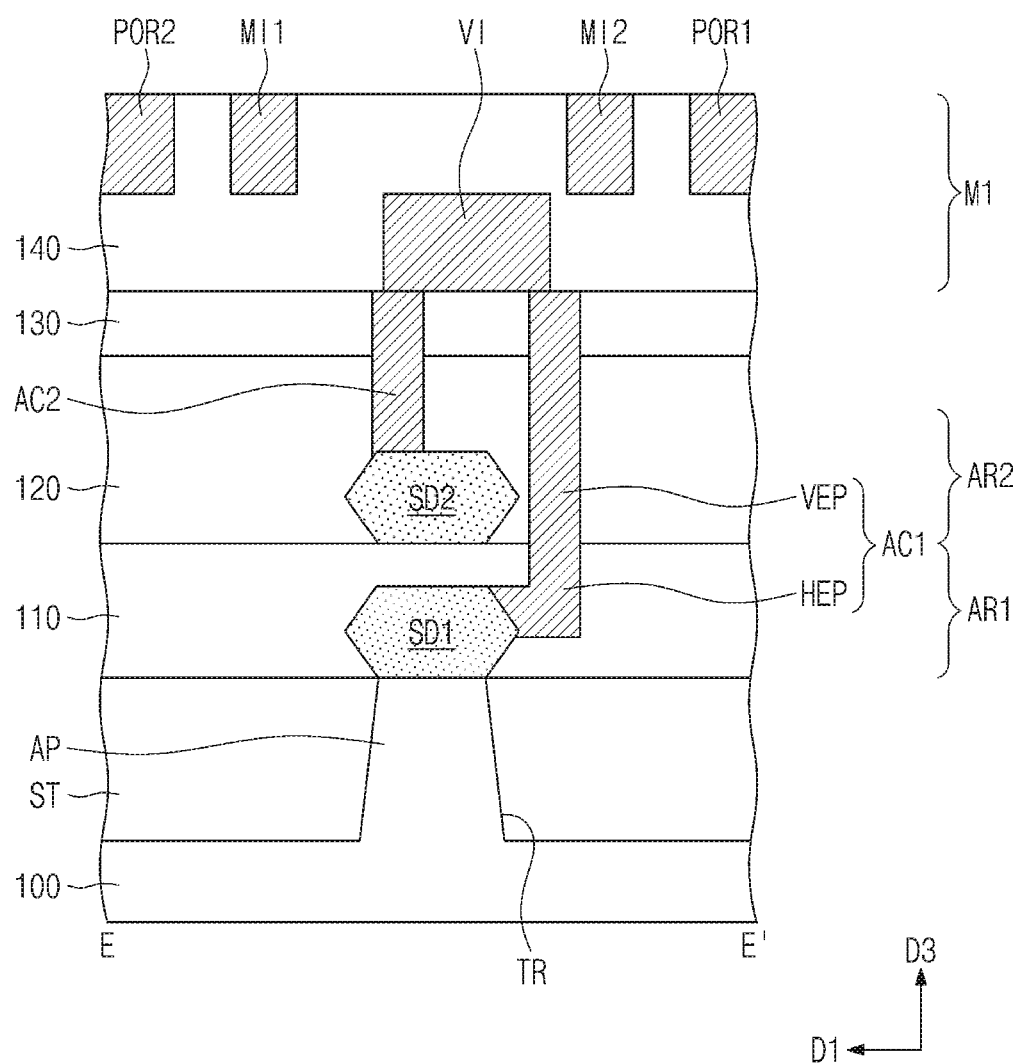

A first active contact AC1 may be provided on at least one lower source/drain pattern SD1 (see FIG. 6E). The first active contact AC1 may include a vertical extension VEP and a horizontal extension HEP. The vertical extension VEP may have a pillar shape that vertically extends while penetrating the first, second, and third interlayer dielectric layers 110, 120, and 130. The vertical extension VEP of the first active contact AC1 may be horizontally offset from the stacked lower and upper source/drain patterns SD1 and SD2. For example, the vertical extension VEP may be spaced apart from the lower and upper source/drain patterns SD1 and SD2 in the first direction D1. The horizontal extension HEP may be provided on a bottom tier of a front-end-of-line (FEOL) layer. The horizontal extension HEP may extend in the first direction D1 from the vertical extension VEP, thereby being coupled to the lower source/drain pattern SD1.

The horizontal and vertical extensions HEP and VEP may be connected to constitute a single first active contact AC1. For example, the first active contact AC1 may include one or more selected from doped semiconductor and metal. The metal may include one or more selected from, for example, copper (Cu), aluminum (Al), ruthenium (Ru), cobalt (Co), tungsten (W), and molybdenum (Mo).

A second active contact AC2 may be provided on at least one upper source/drain pattern SD2 (see FIG. 6E). The second active contact AC2 may be spaced apart in the first direction D1 from the first active contact AC1. The second active contact AC2 may vertically overlap the upper source/drain pattern SD2.

The second active contact AC2 may be provided on a top tier of a front-end-of-line (FEOL) layer. The second active contact AC2 may have a pillar shape that vertically extends, and may be directly coupled to the upper source/drain pattern SD2. For example, the second active contact AC2 may include a material the same as that of the first active contact AC1. When the first active contact AC1 and the second active contact AC2 are formed of metal, during the formation of the first active contact AC1 and the second active contact AC2, silicide patterns may be respectively formed between the first active contact AC1 and the lower source/drain pattern SD1, and between second active contact AC2 and the upper source/drain pattern SD2 to provide reliable metal-semiconductor contact.

A fourth interlayer dielectric layer 140 may be provided on a third interlayer dielectric layer 130. A first metal layer M1 may be provided in the fourth interlayer dielectric layer 140. The first metal layer M1 may include a first power line POR1, a second power line POR2, and first to fourth wiring lines MI1 to MI4.

When viewed in plan, the first power line POR1 may be provided on the first cell boundary CB1, the second power line POR2 may be provided on the second cell boundary CB2. The gate cutting patterns CT may vertically overlap the first and second power lines POR1 and POR2. A drain voltage (VDD) may be applied to one of the first and second power lines POR1 and POR2, and a source voltage (VSS) may be applied to the other of the first and second power lines POR1 and POR2. In an embodiment of the present inventive concept, the source voltage (VSS) may be applied to the first power line POR1, and the drain voltage (VDD) may be applied to the second power lines POR2.

The first to fourth wiring lines MI1 to MI4 may be disposed between the first power line POR1 and the second power line POR2. Each of the first to fourth wiring lines MI1 to MI4 may have a linear or bar shape that extends in the second direction D2. The first and second power lines POR1 and POR2 and the first to fourth wiring lines MI1 to MI4 may include at least one selected from metals such as, for example, copper (Cu), aluminum (Al), ruthenium (Ru), cobalt (Co), tungsten (W), and molybdenum (Mo).

The first metal layer M1 may further include vias VI provided thereunder. One of the vias VI may connect one of the first and second active contacts AC1 and AC2 to one of the first and second power lines POR1 and POR2. Another of the vias VI may connect to each other the first and second active contacts AC1 and AC2 that are adjacent to each other (see FIG. 6E). Still another of the vias VI may connect one of the lower and upper contacts UGC and LGC to one of the first to fourth wiring lines MI1 to MI4 (see FIG. 6D).

Additional metal layers may be stacked on the first metal layer M1. The first metal layer M1 and other metal layers on the first metal layer M1 may constitute a back-end-of-line (BEOL) layer of a semiconductor device. The other metal layers on the first metal layer M1 may include routing lines for connecting logic cells to each other.

A semiconductor device according to the present inventive concept may have a three-dimensional cell structure including NMOS and PMOS field effect transistors. Among the second gate electrodes GE2 of FIG. 5, one may be a first split gate SGE1 and another may be a second split gate SGE2.

Referring to the logic circuit LC of FIG. 4, the first signal A may be input to the first wiring line MI1. The first signal A may be input through the upper gate contact UGC beneath the first wiring line MI1 to the upper gate electrode UGE of the first split gate SGE1. The first signal A may be input through the lower gate contact LGC beneath the first wiring line MI1 to the lower gate electrode LGE of the second split gate SGE2 (See FIGS. 5 and 6B).

The second signal /A may be input to the second wiring line MI2. The second signal /A may be input through the lower gate contact LGC beneath the second wiring line MI2 to the lower gate electrode LGE of the first split gate SGE1. The second signal /A may be input through the upper gate contact UGC beneath the second wiring line MI2 to the upper gate electrode UGE of the second split gate SGE2 (see FIG. 6C). For example, the first wiring line MI1 may be electrically connected to the upper gate contact UGC which is coupled to the upper gate electrode UGE of the first split gate SGE1, and the second wiring line MI2 may be electrically connected to the lower gate contact LGC which is coupled to the lower gate electrode LGE of the first split gate SGE1 (See FIG. 5).

A three-dimensional device according to the present inventive concept may have a split gate structure in which the lower gate electrode LGE and the upper gate electrode UGE are separated from each other, and thus a cross-couple structure of FIG. 4 may be three-dimensionally accomplished.

The first input signal SI1 may be input to the third wiring line MI3, and the second input signal SI2 may be input to the fourth wiring line MI4. Therefore, the logic circuit LC of FIG. 4 may be achieved into a three-dimensional cell structure according to an embodiment of the present inventive concept.

As regards a three-dimensional device according to an embodiment of the present inventive concept, only two gates, or the first split gate SGE1 and the second split gate SGE2, may realize a cross-couple structure. Therefore, there may be a reduction in cell area for constructing the cross-couple structure of FIG. 4. As a result, according to an embodiment of the present inventive concept, a semiconductor device may increase in integration.

Figure 13A:
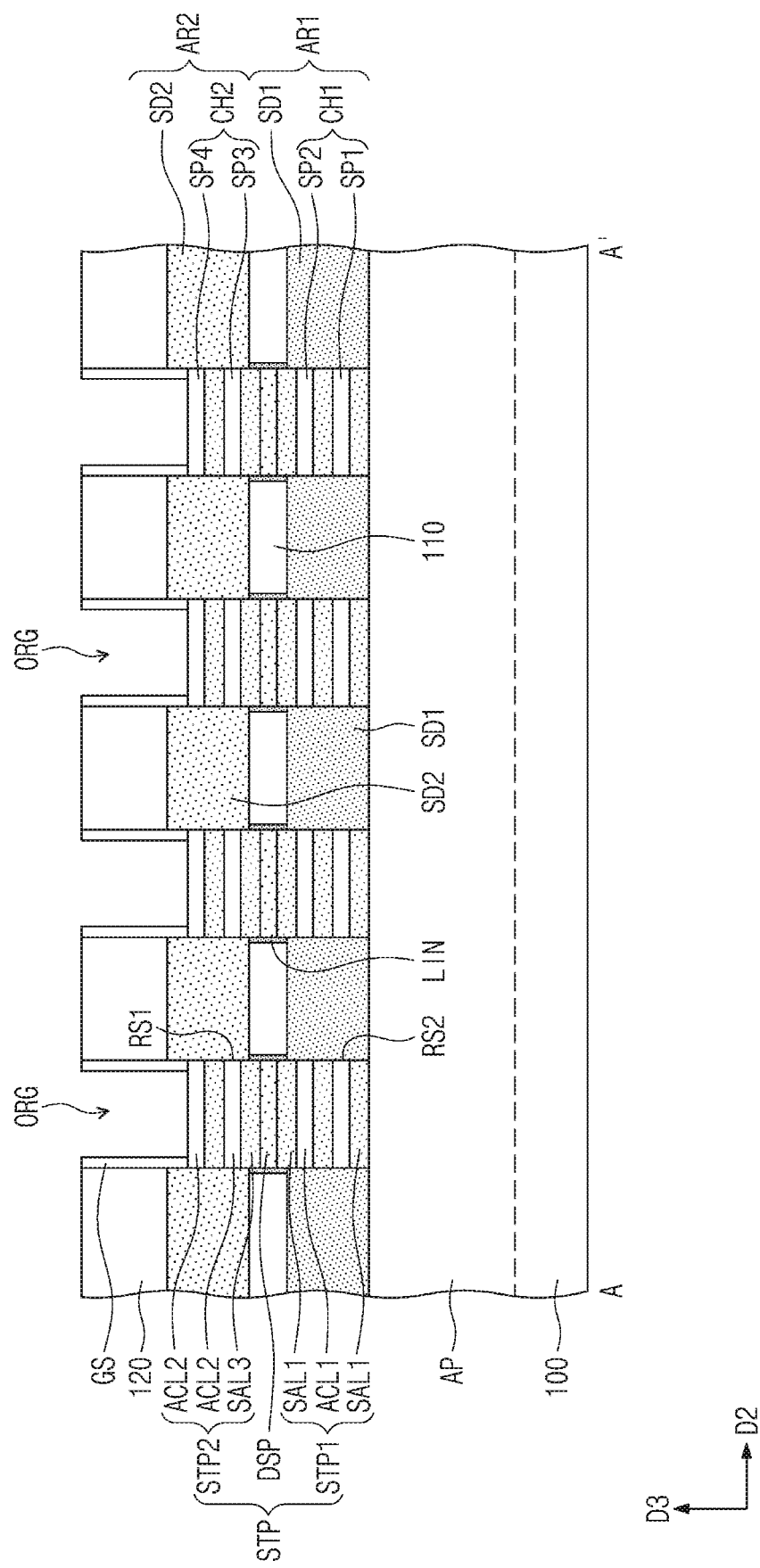
Figure 13B:
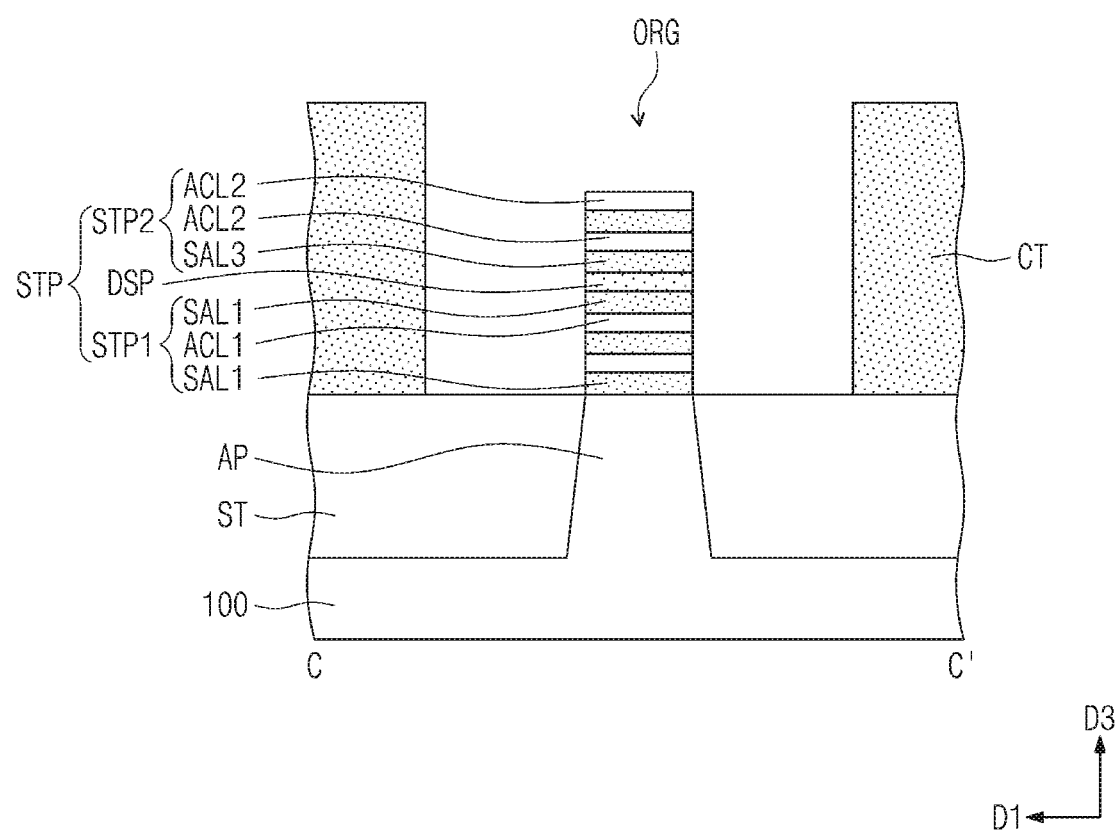
Figure 14A:
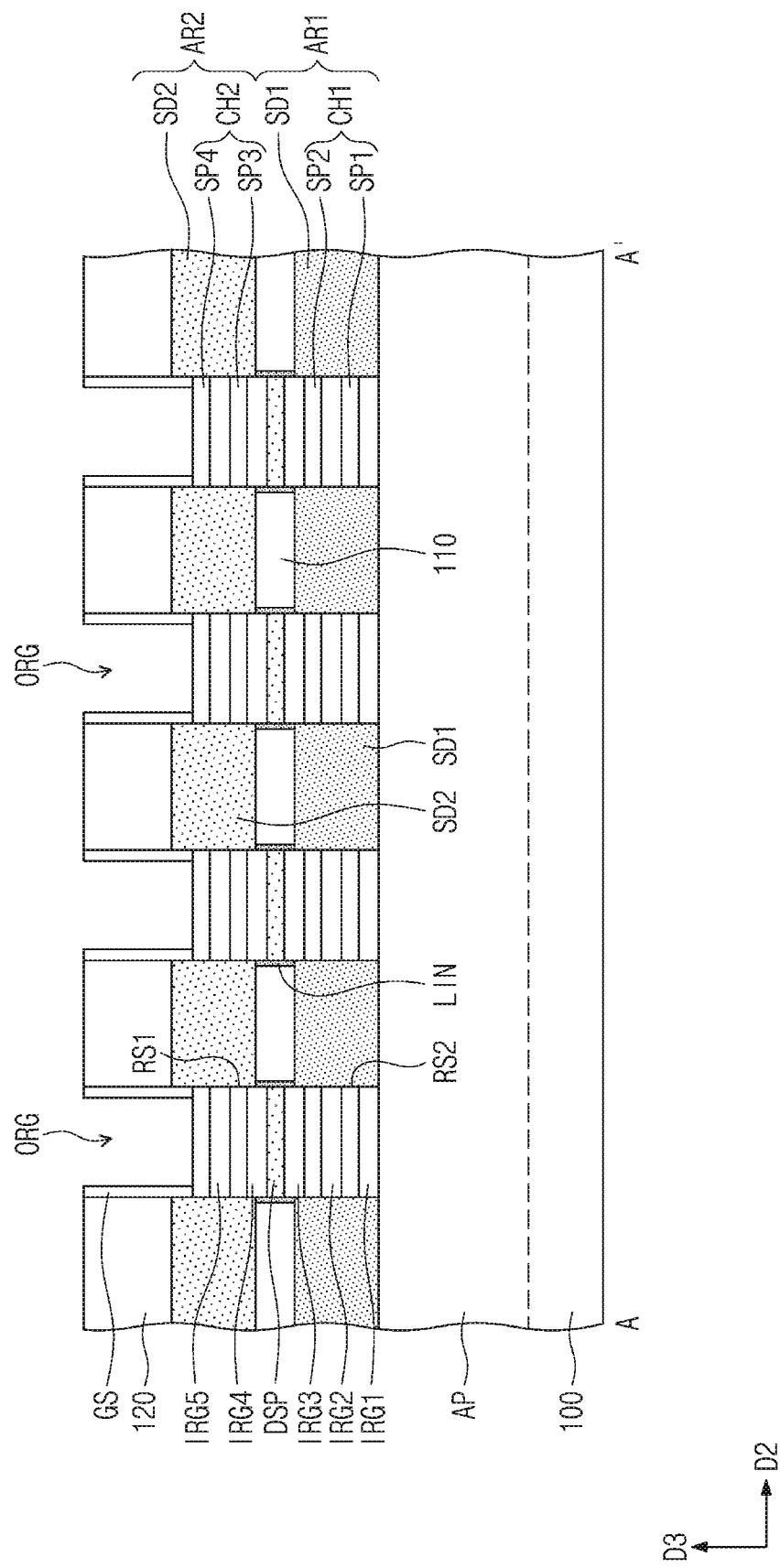
Figure 14B:
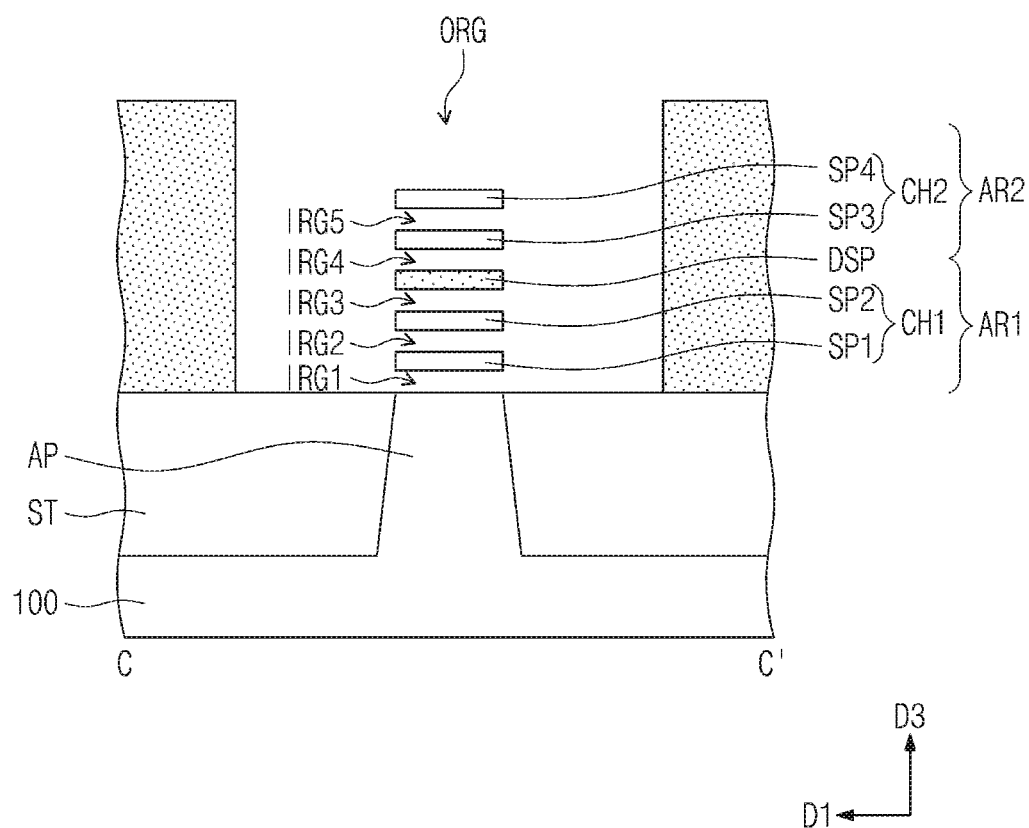
Figure 15A:
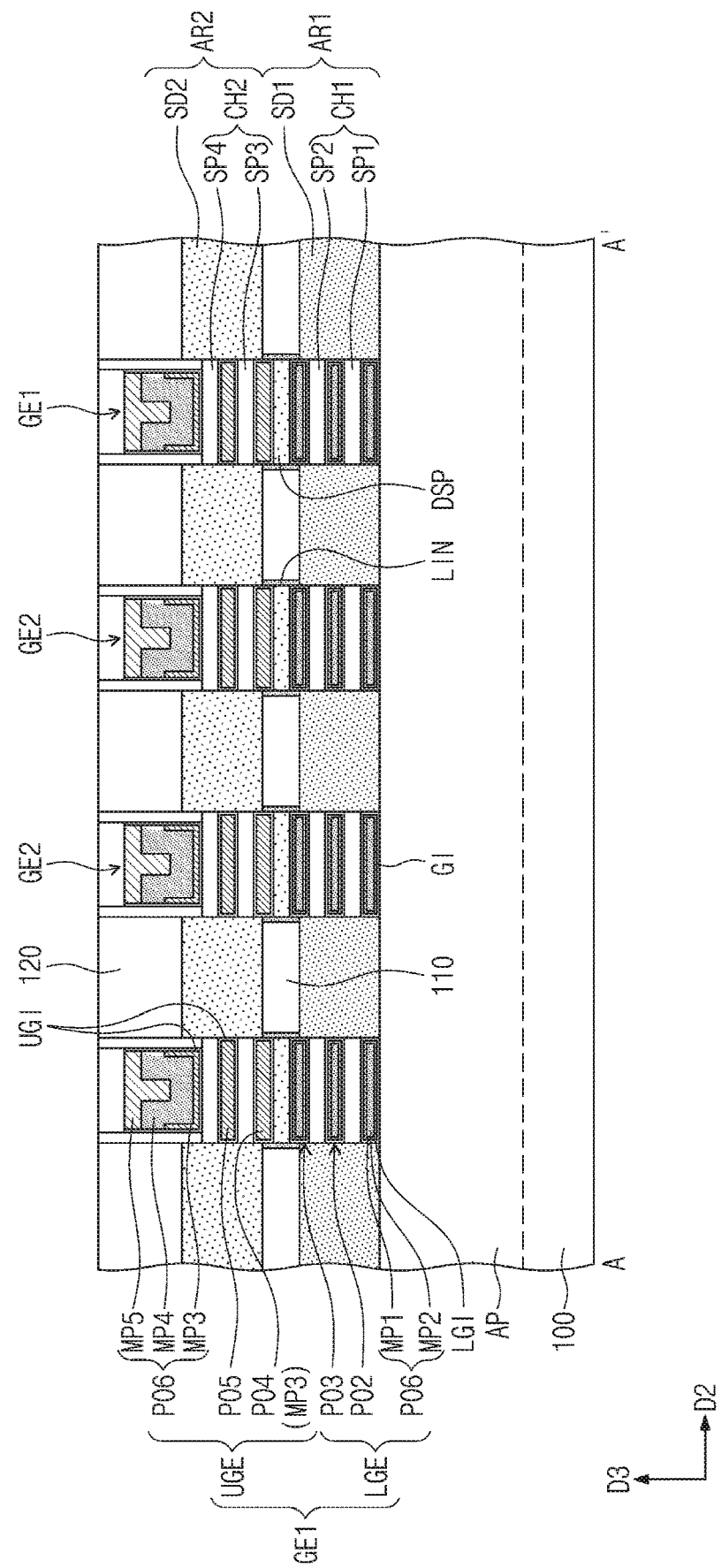
Figure 15B:
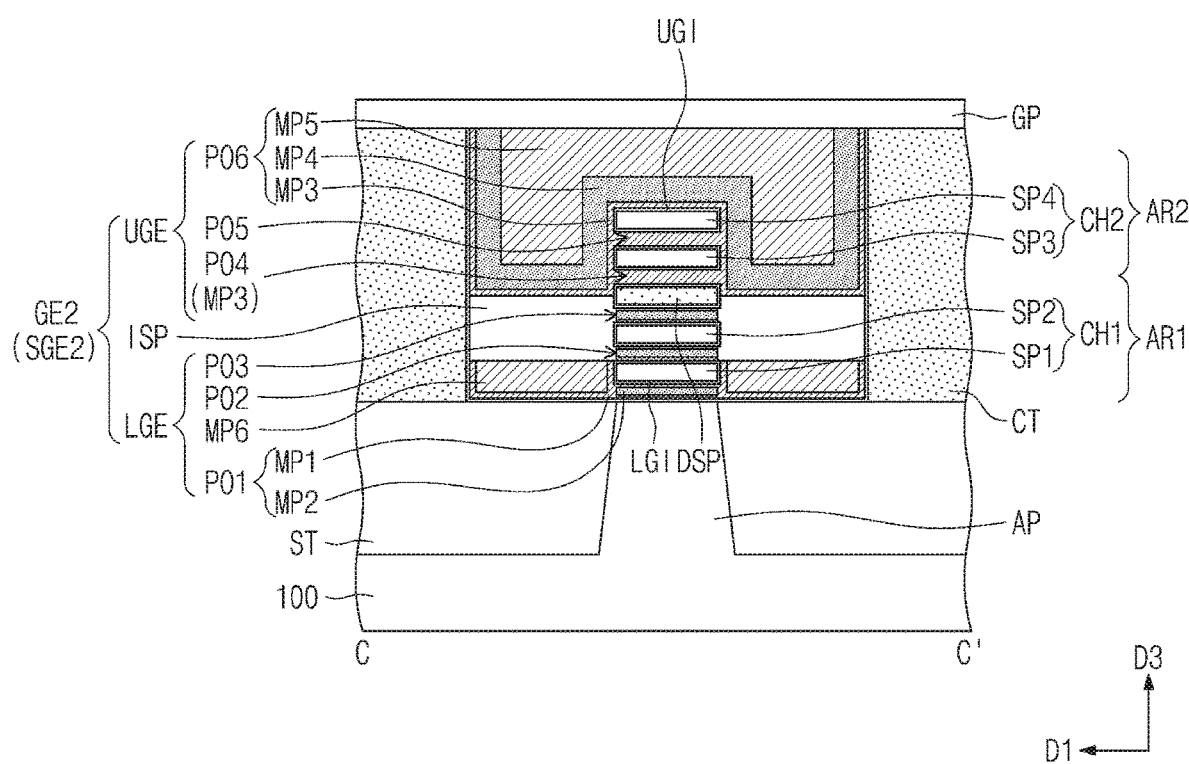
Figure 15C:
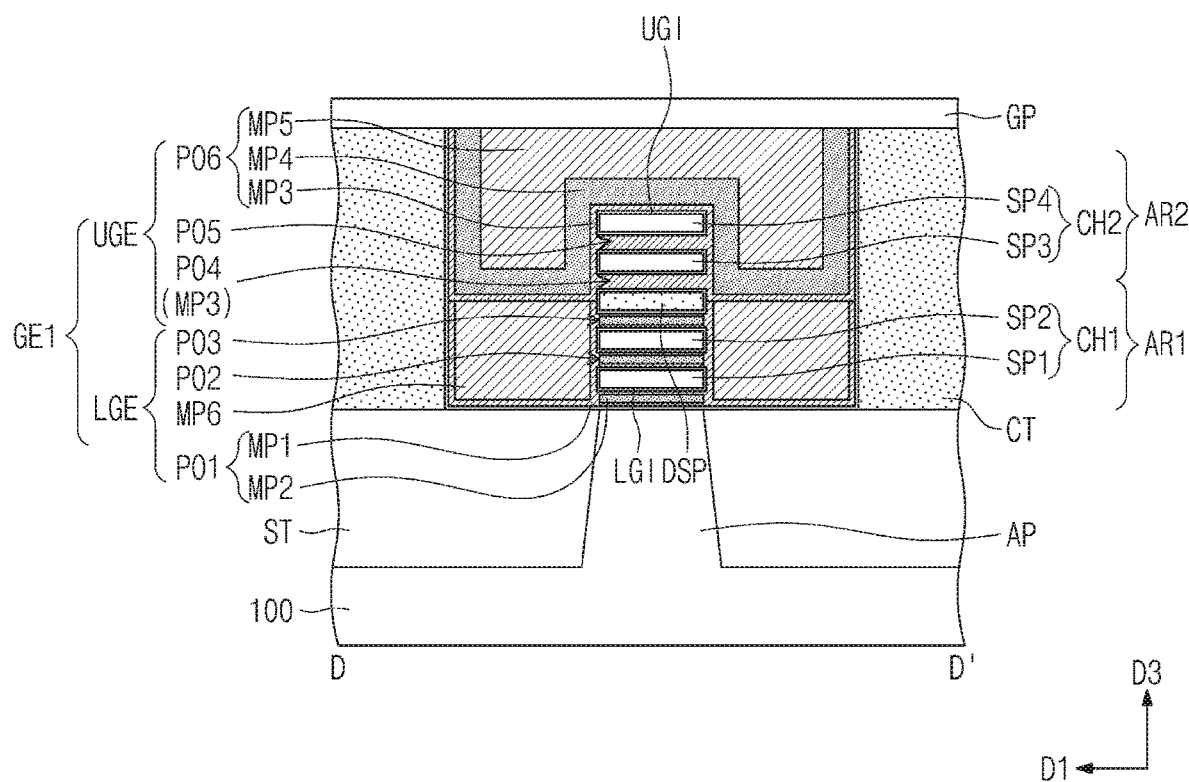

FIGS. 7A to 15C illustrate cross-sectional views showing a method of fabricating a semiconductor device according to an embodiment of the present inventive concept. FIGS. 7A, 8A, 9A, 10A, 11A, 12A, 13A, 14A, and 15A depict cross-sectional views taken along line A-A' of FIG. 5. FIGS. 9B, 10B, 11B, and 12B depict cross-sectional views taken along line E-E' of FIG. 5. FIGS. 7B, 8B, 13B, 14B, and 15B depict cross-sectional views taken along line C-C' of FIG. 5. FIG. 15C depicts a cross-sectional view taken along line D-D' of FIG. 5.

Figure 7A:
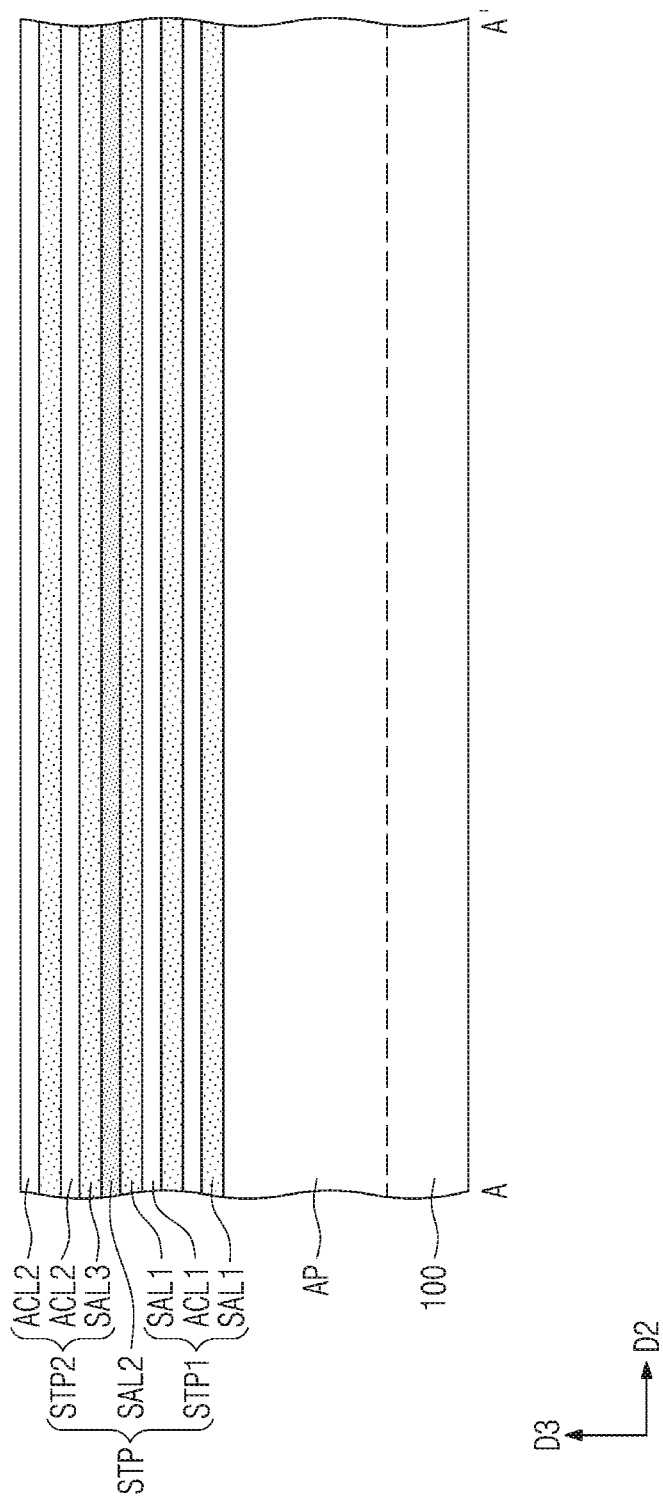
FIGS. 7A, 7B, 8A, 8B, 9A, 9B, 10A, 10B, 11A, 11B, 12A, 12B, 13A, 13B, 14A, 14B, and 15A to 15C illustrate cross-sectional views showing a method of fabricating a semiconductor device according to an embodiment of the present inventive concept.
Figure 7B:
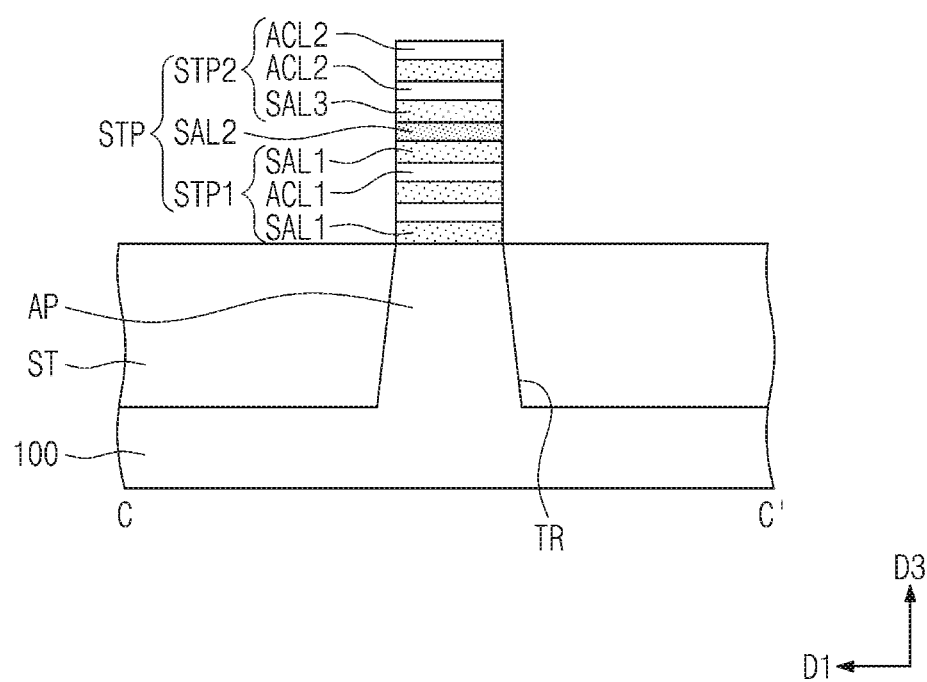

Referring to FIGS. 7A and 7B, first sacrificial layers SAL1 and first active layers ACL1 may be alternately stacked on a substrate 100. The substrate 100 may be a semiconductor substrate. For example, the substrate 100 may be a single crystal semiconductor substrate that may be formed of a semiconductor material such as silicon (Si). The first sacrificial layers SAL1 may include one of, for example, silicon (Si), germanium (Ge), or silicon-germanium (SiGe), and the first active layers ACL1 may include another of, for example, silicon (Si), germanium (Ge), or silicon-germanium (SiGe). For example, the first sacrificial layers SAL1 may include silicon-germanium (SiGe) formed by an epitaxial growth process, and the first active layers ACL1 may include silicon (Si) formed by an epitaxial growth process. Each of the first sacrificial layers SAL1 may have a germanium (Ge) concentration of about 10 at % to about 30 at %.

A second sacrificial layer SAL2 may be formed on an uppermost first active layer ACL1. In an embodiment of the present inventive concept, the second sacrificial layer SAL2 may have a thickness substantially the same as that of the first sacrificial layer SAL1. In an embodiment of the present inventive concept, the second sacrificial layer SAL2 may have a thickness greater than that of the first active layer ACL1 and that of the first sacrificial layer SAL1. The second sacrificial layer SAL2 may include silicon (Si) or silicon-germanium (SiGe). When the second sacrificial layer SAL2 includes silicon-germanium (SiGe), the second sacrificial layer SAL2 may have a germanium (Ge) concentration greater than that of the first sacrificial layer SAL1. For example, the second sacrificial layer SAL2 may have a germanium (Ge) concentration of about 40 at % to about 90 at %.

Third sacrificial layers SAL3 and second active layers ACL2 may be alternately staked on the second sacrificial layer SAL2. Each of the third sacrificial layers SAL3 may include a material the same as that of the first sacrificial layers SAL1, and each of the second active layers ACL2 may include a material the same as that of the first active layer ACL1. The second sacrificial layer SAL2 may be interposed between the first sacrificial layer SAL1 and the third sacrificial layer SAL3.

A stack pattern STP may be formed by patterning the stacked first, second, and third sacrificial layers SAL1, SAL2, and SAL3 and the stacked first and second active layers ACL1 and ACL2. The formation of the stack pattern STP may include forming a hardmask pattern on an uppermost second active layer ACL2, and using the hardmask pattern as an etching mask to etch the layers SAL1, SAL2, SAL3, ACL1, and ACL2 that are stacked on the substrate 100. During the formation of the stack pattern STP, an upper portion of the substrate 100 may be patterned to form a trench TR that defines an active pattern AP. The stack pattern STP may have a bar shape that extends in a second direction D2.

The stack pattern STP may include a lower stack pattern STP1 on the active pattern AP, an upper stack pattern STP2 on the lower stack pattern STP1, and the second sacrificial layer SAL2 between the lower and upper stack patterns STP1 and STP2. The lower stack pattern STP1 may include the first sacrificial layers SAL1 and the first active layers ACL1 that are alternately stacked. The upper stack pattern STP2 may include the third sacrificial layers SAL3 and the second active layers ACL2 that are alternately stacked.

A device isolation layer ST may be formed on the substrate 100, filling the trench TR. For example, a dielectric layer may be formed on an entire surface of the substrate 100, covering the active pattern AP and the stack pattern STP. The dielectric layer may be recessed to form the device isolation layer ST until the stack pattern STP is exposed. The device isolation layer ST may have a top surface at a level the same as or lower than that of a top surface of the active pattern AP.

Figure 8A:
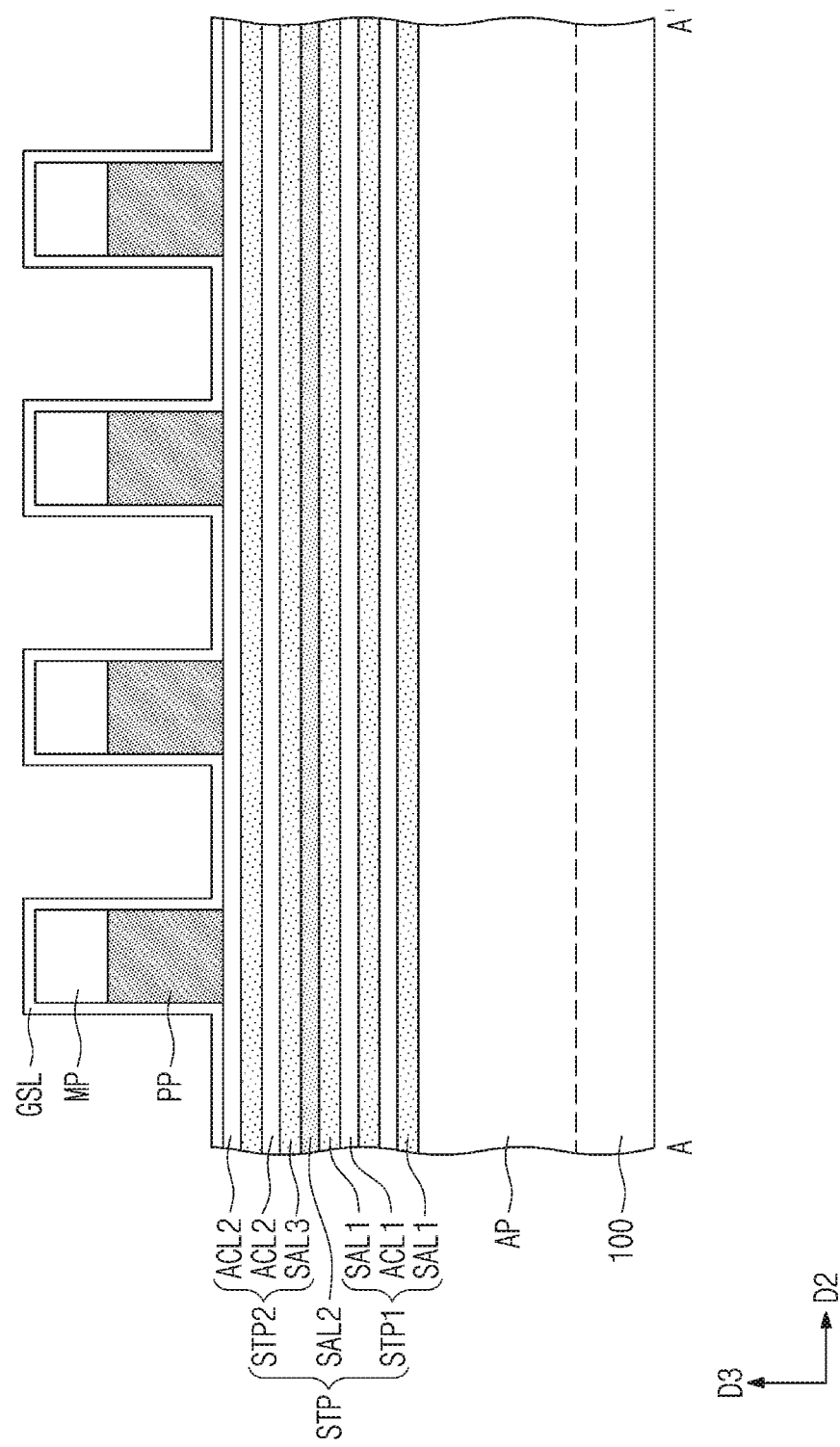
Figure 8B:
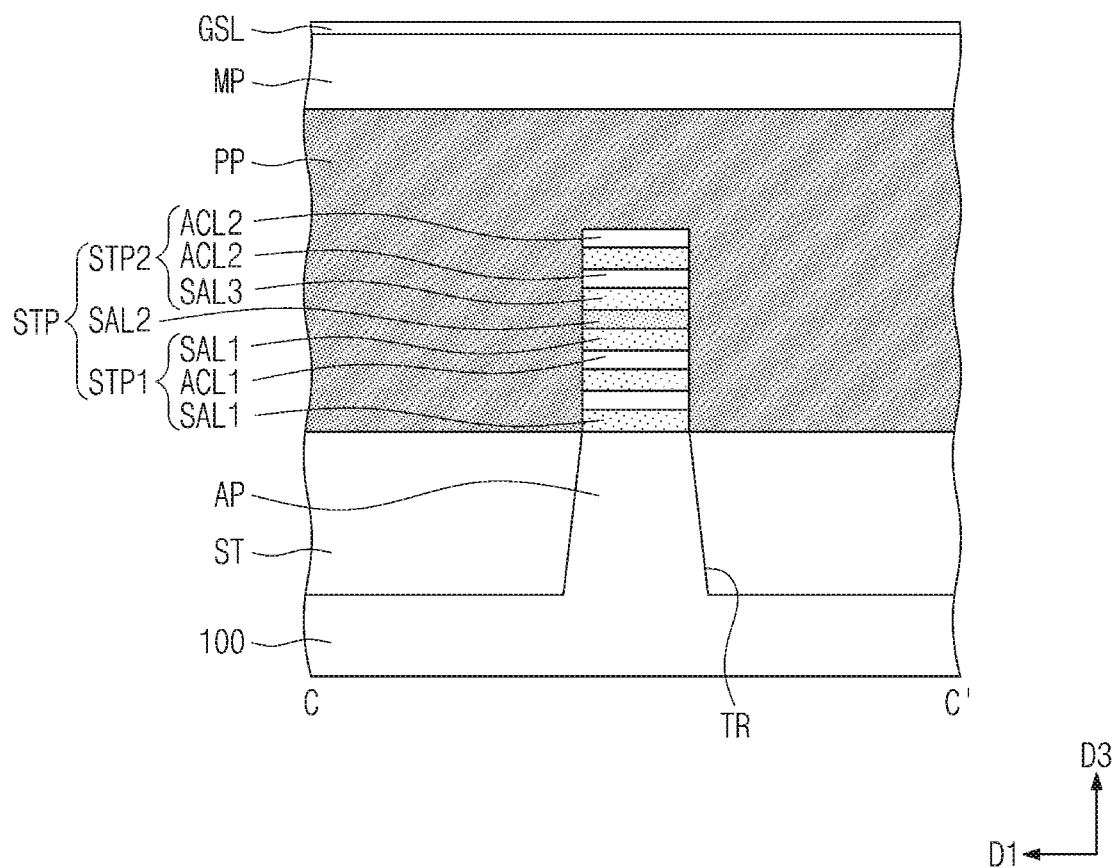

Referring to FIGS. 8A and 8B, sacrificial patterns PP may be formed to run across the stack pattern STP. Each of the sacrificial patterns PP may be formed to have a linear shape that extends in the first direction D1. The sacrificial patterns PP may be arranged at a first pitch along the second direction D2.

The formation of the sacrificial patterns PP may include forming a sacrificial layer on the entire surface of the substrate 100, forming hardmask patterns MP on the sacrificial layer, and using the hardmask patterns MP as an etching mask to pattern the sacrificial layer. The sacrificial layer may include one or more selected from, for example, amorphous silicon (a-Si) and polysilicon (p-Si).

A spacer layer GSL may be conformally formed on the entire surface of the substrate 100. The spacer layer GSL may cover the sacrificial patterns PP and the hardmask patterns MP. For example, the spacer layer GSL may include one or more selected from, for example, silicon carbonitride (SiCN), silicon carbon oxynitride (SiCON), and silicon ($Si_3N_4$)

Figure 9A:
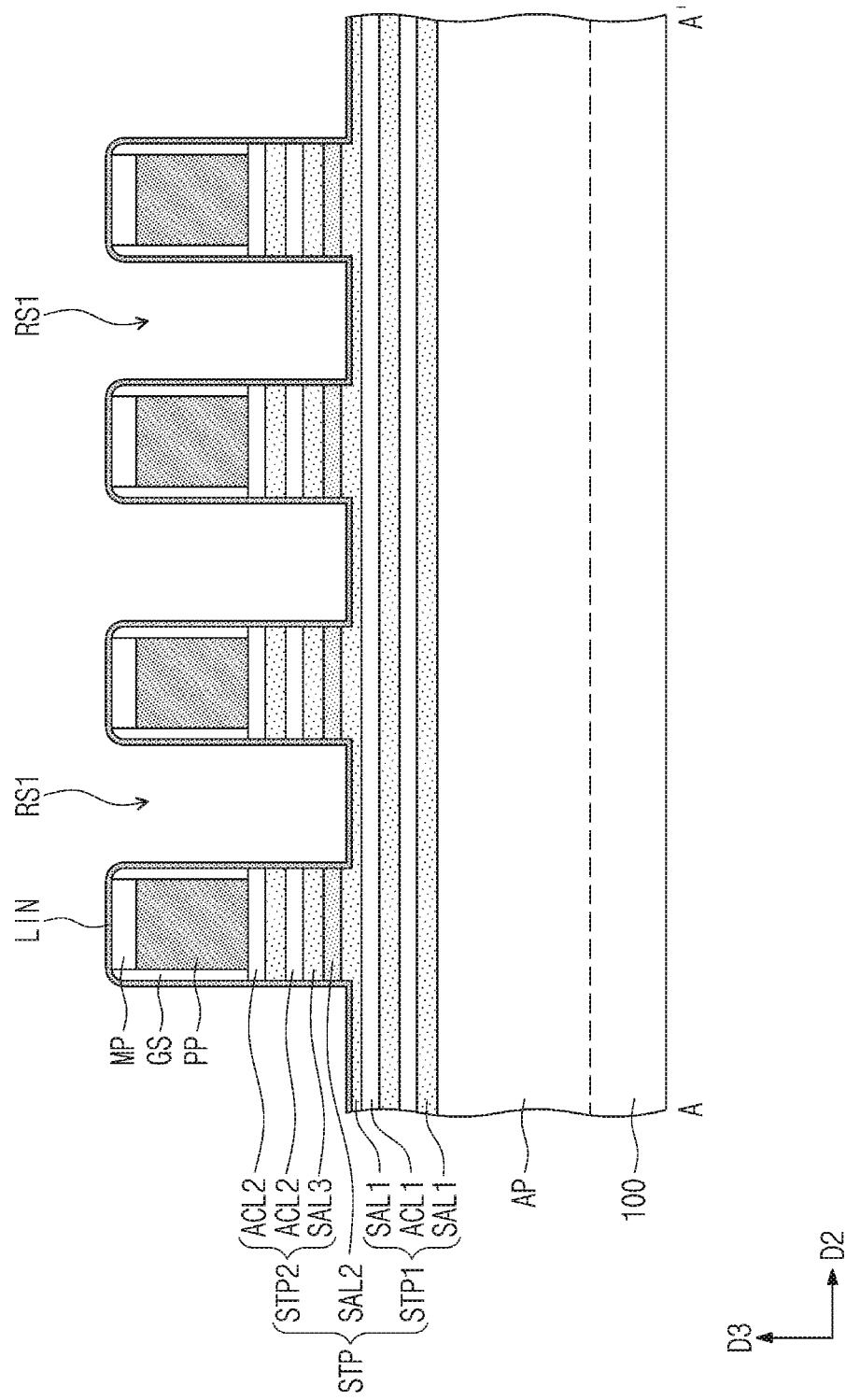
Figure 9B:
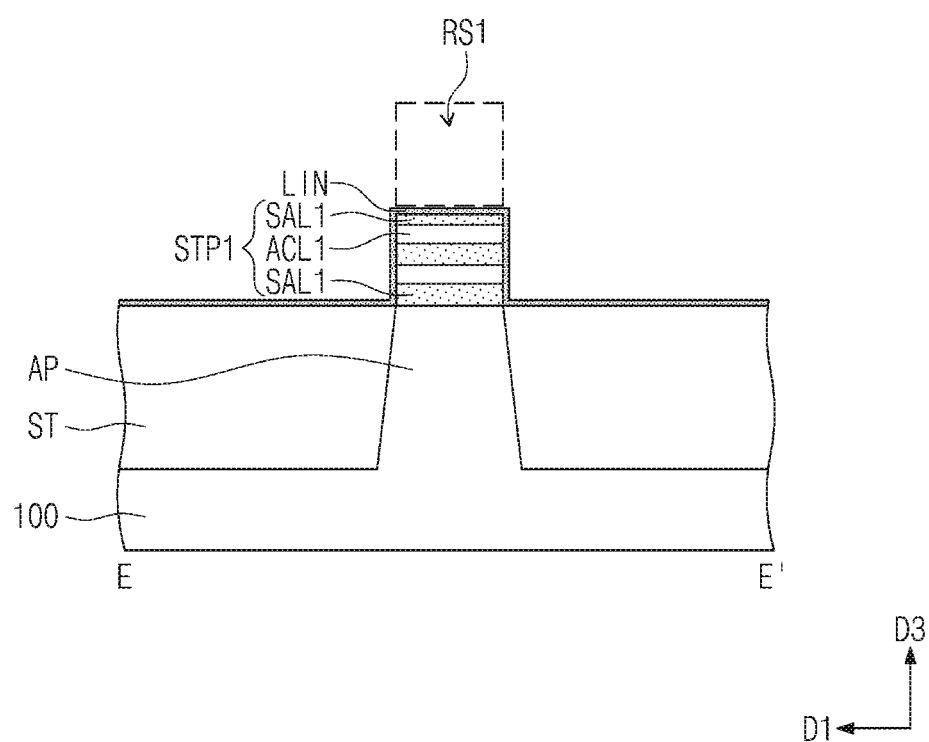

Referring to FIGS. 9A and 9B, the spacer layer GSL and the hardmask patterns MP may be used as an etching mask to perform a first etching process on the stack pattern STP. The first etching process may form a first recess RS1 in the stack pattern STP between the sacrificial patterns PP. The first recess RS1 may be formed between a pair of sacrificial patterns PP.

The first etching process may be an anisotropic etching process. The first etching process may convert the spacer layer GSL into gate spacers GS that cover sidewalls of the sacrificial patterns PP. The first etching process may continue until an uppermost first sacrificial layer SAL1 of the lower stack pattern STP1 is exposed. For example, the first recess RS1 may expose the lower stack pattern STP1.

A liner layer LIN may be conformally formed on the entire surface of the substrate 100, and may cover the gate spacers GS and the hardmask patterns MP. The liner layer LIN may cover an inner wall of the first recess RS1, and the exposed lower stack pattern STP1. For example, the liner layer LIN may include silicon nitride ($Si_3N_4$).

Figure 10A:
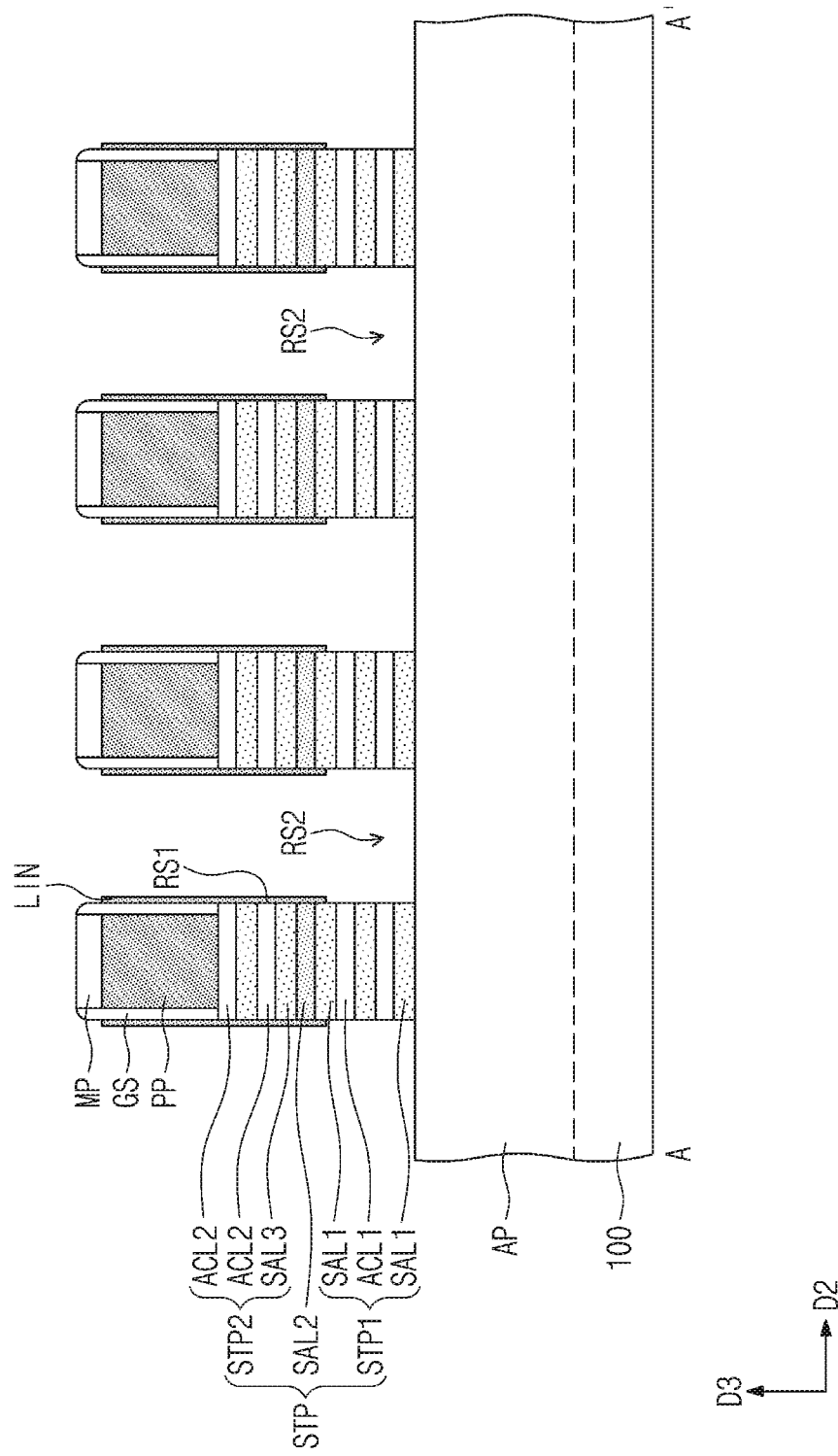
Figure 10B:
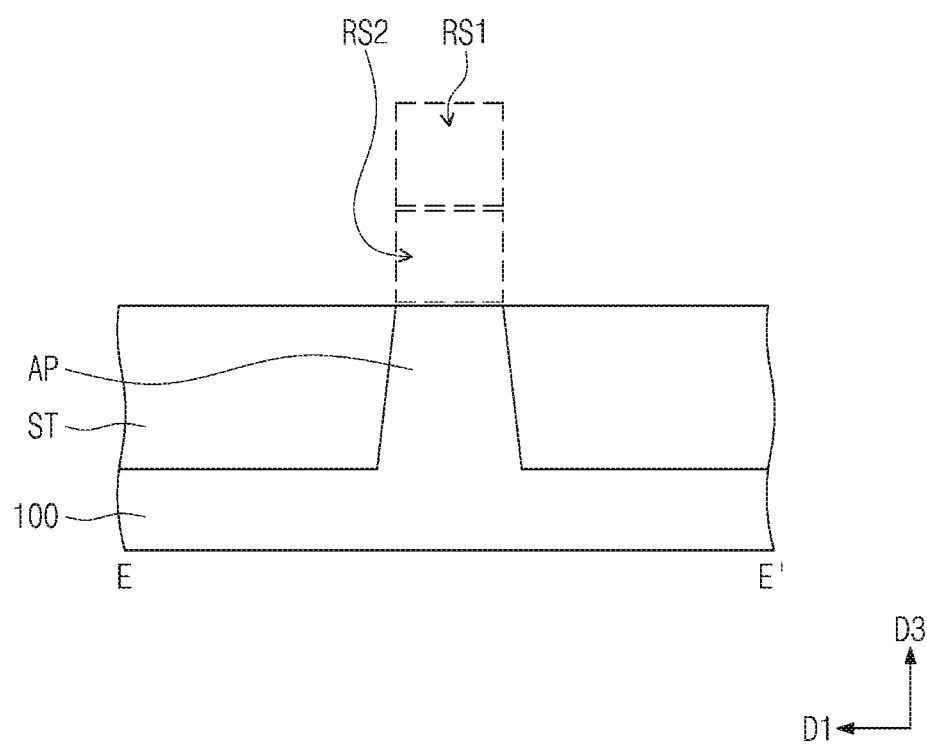

Referring to FIGS. 10A and 10B, the liner layer LIN, the gate spacers GS, and the hardmask patterns MP may be used as an etching mask to perform a second etching process on the stack pattern STP. The second etching process may remove the lower stack pattern STP1 between the sacrificial patterns PP, thereby forming a second recess RS2. The second recess RS2 may further extend downwardly from the first recess RS1.

The second etching process may be an anisotropic etching process, and may be performed until a top surface of the active pattern AP is exposed. For example, the second recess RS2 may expose the top surface of the active pattern AP.

Figure 11A:
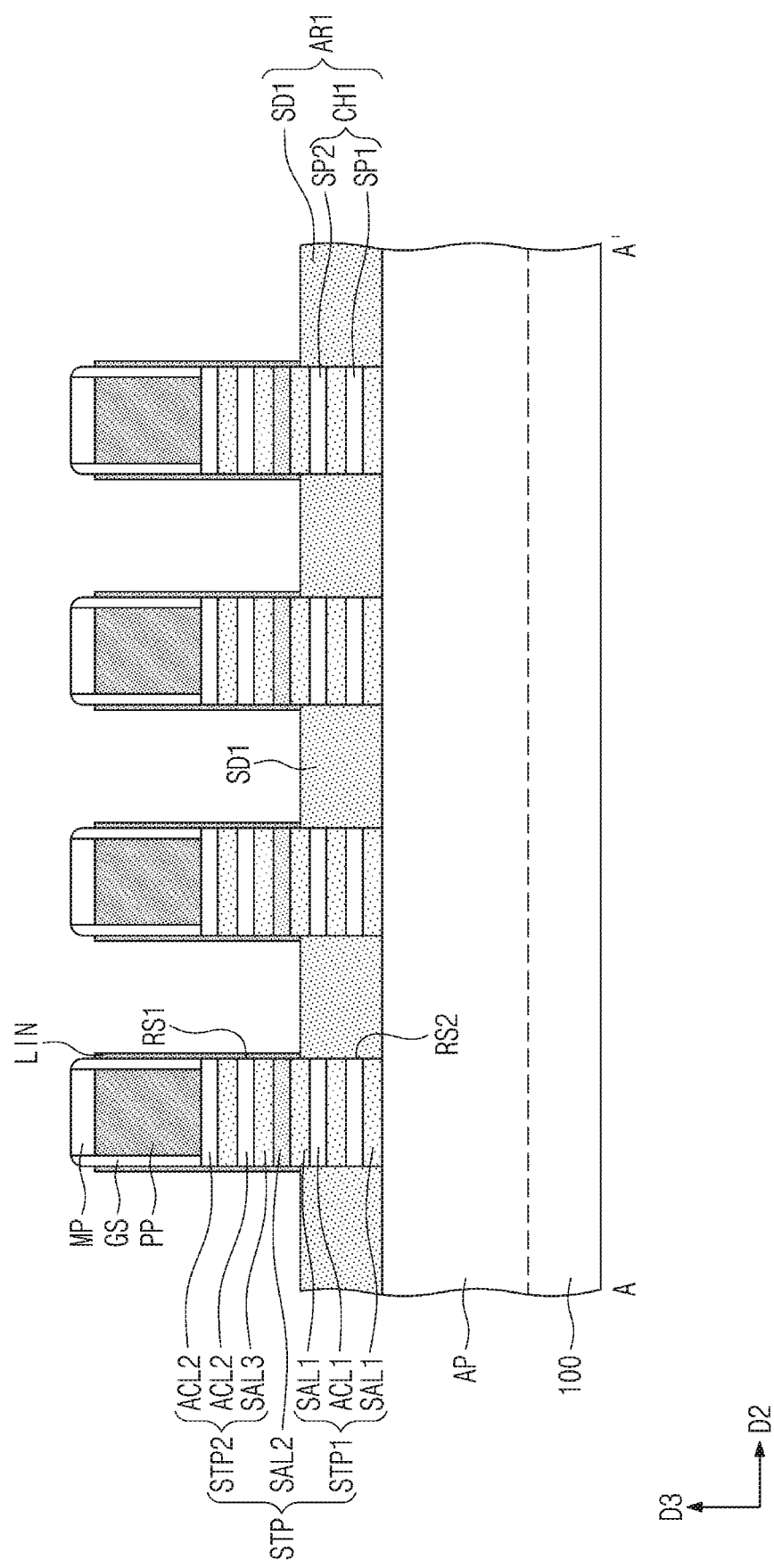
Figure 11B:
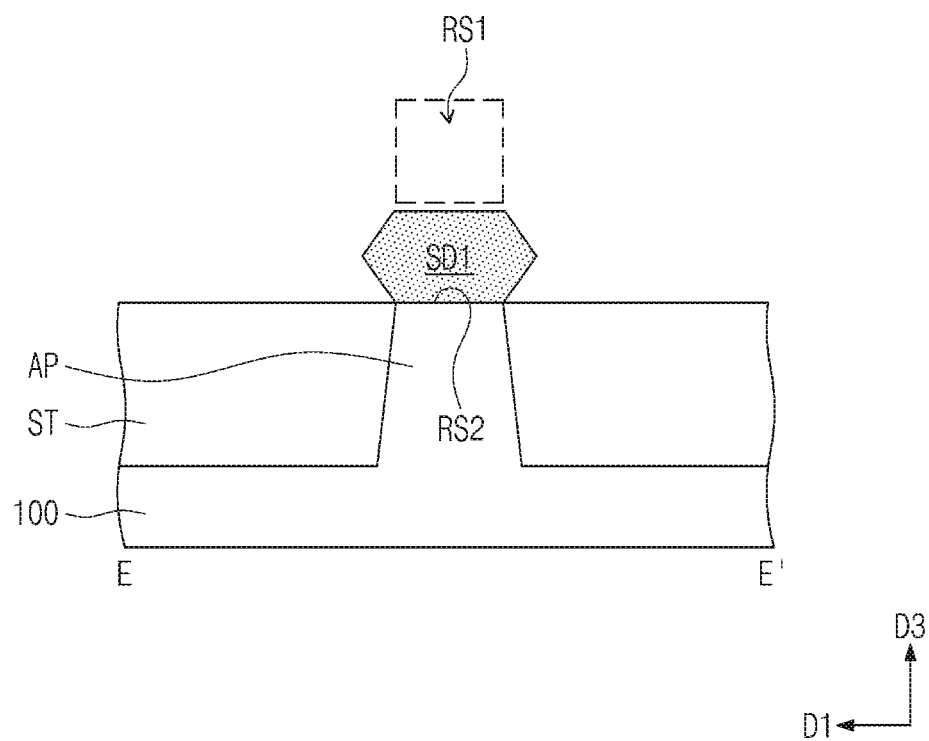

Referring to FIGS. 11A and 11B, lower source/drain patterns SD1 may be correspondingly formed in the second recesses RS2. For example, the lower source/drain pattern SD1 may be formed by performing a first selective epitaxial growth (SEG) process in which an inner wall of the second recess RS2 is used as a seed layer. The lower source/drain pattern SD1 may be grown from a seed, or the first active layers ACL1 and the substrate 100 that are exposed to the second recess RS2. For example, the first SEG process may include chemical vapor deposition (CVD) or molecular beam epitaxy (MBE).

The lower source/drain pattern SD1 may be in-situ doped with impurities during the first SEG process. Alternatively, after the formation of the lower source/drain pattern SD1, impurities may be implanted into the lower source/drain pattern SD1. The lower source/drain pattern SD1 may be doped to have a first conductivity type (e.g., n-type). In an embodiment of the present inventive concept, the lower source/drain pattern SD1 may include a silicon (Si) layer doped with n-type dopants such as, for example, phosphorus (P), arsenic (As), antimony (Sb) and/or bismuth (Bi).

A lower channel pattern CH1 may be constituted by the first active layers ACL1 interposed between a pair of lower source/drain patterns SD1. For example, the first active layers ACL1 may be formed into first and second semiconductor patterns SP1 and SP2 of the lower channel pattern CH1. The first and second semiconductor patterns SP1 and SP2 may be connected to the pair of lower source/drain patterns SD1. The lower channel patterns CH1 and the lower source/drain patterns SD1 may constitute a first active region AR1 as a bottom tier of a three-dimensional device.

Because the liner layer LIN covers the inner wall of the first recess RS1, no semiconductor layer may be separately formed in the first recess RS1 during the first SEG process.

Figure 12A:
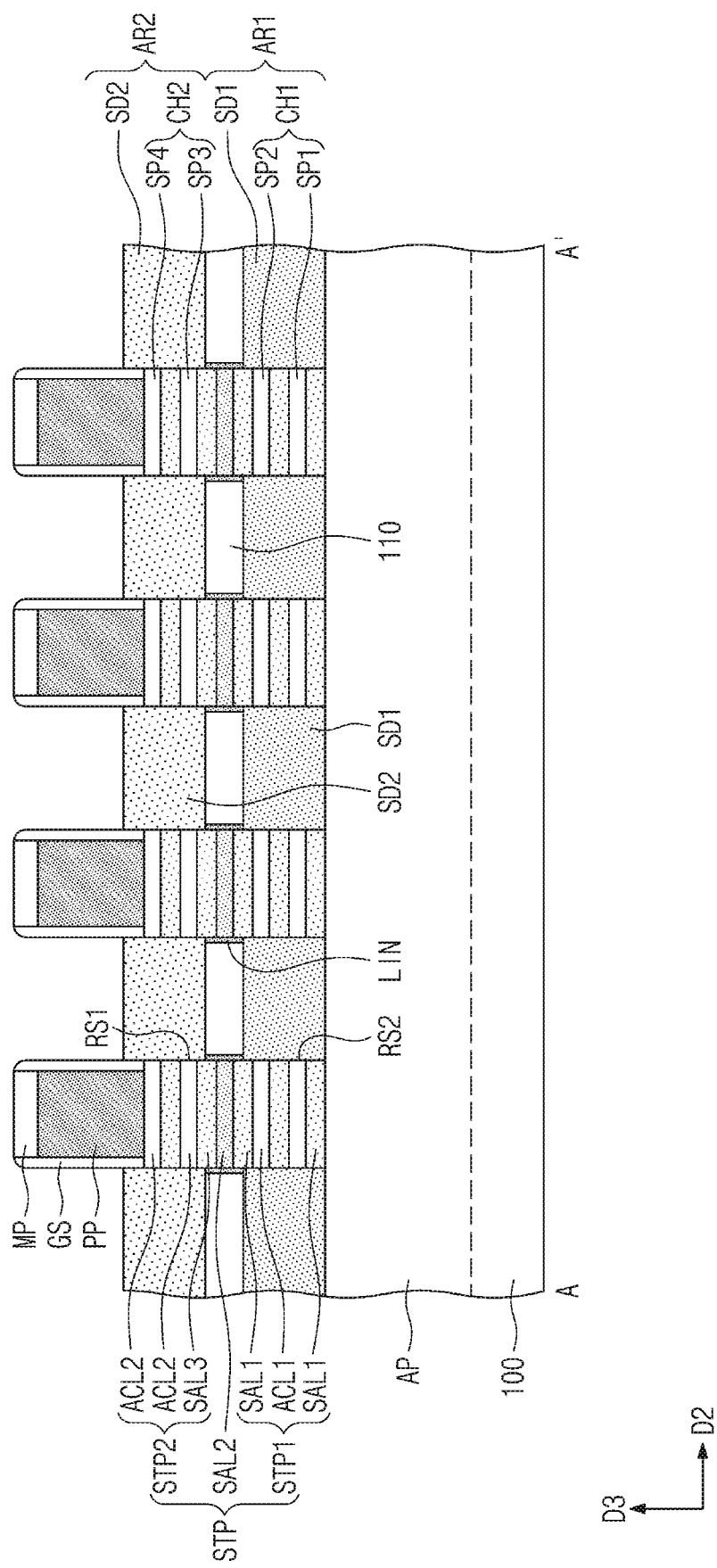
Figure 12B:
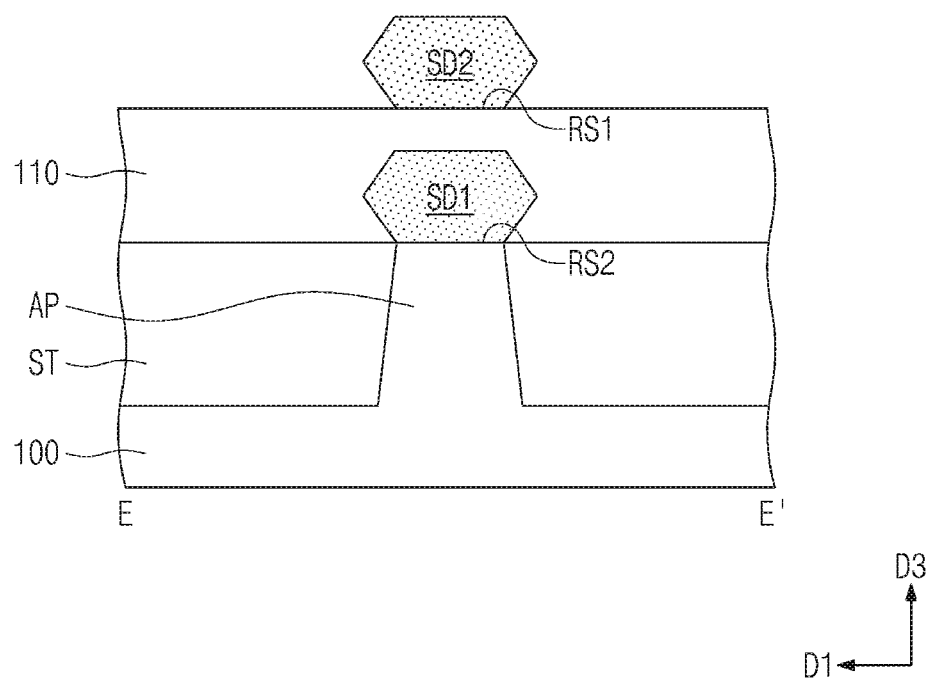

Referring to FIGS. 12A and 12B, a first interlayer dielectric layer 110 may be formed to cover the lower source/drain patterns SD1. The first interlayer dielectric layer 110 may be recessed to have a top surface lower than a bottom surface of a lowermost second active layer ACL2.

The liner layer LIN exposed to the first recess RS1 may be partially removed. The liner layer LIN covered with the first interlayer dielectric layer 110 may cover a sidewall of the second sacrificial layer SAL2. For example, the portion of the liner layer LIN covered by the first interlayer dielectric layer 110 may not be removed in this removal process. The removal of the liner layer LIN may allow the first recess RS1 to expose the second active layers ACL2.

Upper source/drain patterns SD2 may be correspondingly formed in the first recesses RS1. For example, the upper source/drain pattern SD2 may be formed by performing a second selective epitaxial growth (SEG) process in which the inner wall of the first recess RS1 is used as a seed layer. The upper source/drain pattern SD2 may be grown from a seed, or the second active layers ACL2 exposed to the first recess RS1. The upper source/drain pattern SD2 may be in-situ doped with impurities during the second SEG process. Alternatively, after the formation of the upper source/drain pattern SD2, impurities may be implanted into the upper source/drain pattern SD2. The upper source/drain patterns SD2 may be doped to have a second conductivity type (e.g., p-type) different from the first conductivity type. In an embodiment of the present inventive concept, the upper source/drain pattern SD2 may include a silicon germanium (SiGe) layer doped with p-type dopants such as, for example, boron (B), aluminum (Al), gallium (Ga), and/or indium (In). Alternatively, the upper source/drain pattern SD2 may include a silicon (Si) layer doped with p-type dopants such as, for example, boron (B), aluminum (Al), gallium (Ga), and/or indium (In).

An upper channel pattern CH2 may be constituted by the second active layers ACL2 interposed between a pair of upper source/drain patterns SD2. For example, the second active layers ACL2 may be formed into third and fourth semiconductor patterns SP3 and SP4 of the upper channel pattern CH2. The third and fourth semiconductor patterns SP3 and SP4 may be connected to the pair of upper source/drain patterns SD2. The upper channel patterns CH2 and the upper source/drain patterns SD2 may constitute a second active region AR2 as a top tier of a three-dimensional device.

Referring to FIGS. 13A and 13B, a second interlayer dielectric layer 120 may be formed to cover the hardmask patterns MP, the gate spacers GS, and the upper source/drain patterns SD2. For example, the second interlayer dielectric layer 120 may include a silicon oxide ($SiO_2$) layer.

The second interlayer dielectric layer 120 may be planarized until top surfaces of the sacrificial patterns PP are exposed. An etch-back or chemical mechanical polishing (CMP) process may be employed to planarize the second interlayer dielectric layer 120. The hardmask patterns MP may all be removed during the planarization process. As a result, the second interlayer dielectric layer 120 may have a top surface coplanar with those of the sacrificial patterns PP and those of the gate spacers GS.

Gate cutting patterns CT may be formed to penetrate the sacrificial patterns PP, and may be formed on first and second cell boundaries CB1 and CB2 of a logic cell. The gate cutting patterns CT may include one or more selected from, for example, a silicon oxide ($SiO_2$) layer and a silicon nitride ($Si_3N_4$) layer.

The exposed sacrificial patterns PP may be selectively removed. The removal of the sacrificial patterns PP may form an outer region ORG that exposes the lower and upper channel patterns CH1 and CH2 (see FIG. 13B). The removal of the sacrificial patterns PP may include performing a wet etching process using an etchant that selectively etches polysilicon (p-Si).

A dummy channel pattern DSP may replace the second sacrificial layer SAL2 exposed to the outer region ORG. For example, the formation of the dummy channel pattern DSP may include using the outer region ORG to selectively remove the second sacrificial layer SAL2, and forming the dummy channel pattern DSP in an area where the second sacrificial layer SAL2 is removed. Since the second sacrificial layer SAL2 may have a high germanium (Ge) concentration of about 40 at % to about 90 at %, it may have high etch selectivity with respect to other components and may be selectively removed with an etching process. For example, the removal of the second sacrificial layer SAL2 may include performing a wet etching process using an etchant that selectively etches silicon germanium (SiGe) having high germanium (Ge) concentration. According to an embodiment of the present inventive concept, the dummy channel pattern DSP may include a dielectric material, such as, for example, a silicon oxide ($SiO_2$) layer or a silicon nitride ($Si_3N_4$) layer.

Referring to FIGS. 14A and 14B, the first and third sacrificial layers SAL1 and SAL3 exposed to the outer region ORG may be selectively removed to form first to fifth inner regions IRG1 to IRG5 (see FIG. 14B). For example, an etching process may be performed in which the first and third sacrificial layers SAL1 and SAL3 are selectively etched, such that the first and third sacrificial layers SAL1 and SAL3 may be removed while leaving the first to fourth semiconductor patterns SP1 to SP4. The etching process may have a high etch rate with respect to silicon-germanium (SiGe) whose germanium (Ge) concentration is relatively high. For example, the etching process may have a high etch rate with respect to silicon-germanium (SiGe) whose germanium (Ge) concentration is greater than about 10 at %. For example, to form the first to fifth inner regions IRG1 to IRG5, the first and third sacrificial layers SAL1 and SAL3 may be selectively etched by using an etching selectivity difference between the first sacrificial layers SAL1 and the first active layers ACL1 (i.e., the first and second semiconductor patterns SP1 and SP2) and between the third sacrificial layers SAL3 and the second active layers ACL2 (i.e., the third and fourth semiconductor patterns SP3 and SP4). In an embodiment of the present inventive concept, the first to fifth inner regions IRG1 to IRG5 may be formed by a wet etching process.

The selective removal of the first and third sacrificial layers SAL1 and SAL3 may cause the first and second semiconductor patterns SP1 and SP2 to remain on the first active region AR1, and may also cause the third and fourth semiconductor patterns SP3 and SP4 to remain on the second active region AR2. A first inner region IRG1 may be defined to indicate an empty space between the active pattern AP and the first semiconductor pattern SP1, a second inner region IRG2 may be defined to indicate an empty space between the first semiconductor pattern SP1 and the second semiconductor pattern SP2, and a third inner region IRG3 may be defined to indicate an empty space between the second semiconductor pattern SP2 and the dummy channel pattern DSP. A fourth inner region IRG4 may be defined to indicate an empty space between the dummy channel pattern DSP and the third semiconductor pattern SP3, and a fifth inner region IRG5 may be defined to indicate an empty space between the third semiconductor pattern SP3 and the fourth semiconductor pattern SP4.

Referring to FIGS. 15A, 15B, and 15C, gate dielectric layers UGI and LGI may be conformally formed on the exposed first to fourth semiconductor patterns SP1 to SP4. For example, a lower gate dielectric layer LGI may be formed on the first and second semiconductor patterns SP1 and SP2, and an upper gate dielectric layer UGI may be formed on the third and fourth semiconductor patterns SP3 and SP4.

A lower gate electrode LGE may be formed on the lower gate dielectric layer LGI. The formation of the lower gate electrode LGE may include forming first, second, and third portions PO1, PO2 and PO3 in the first, second, and third inner regions IRG1, IRG2, and IRG3, respectively. An upper gate electrode UGE may be formed on the upper gate dielectric layer UGI. The formation of the upper gate electrode UGE may include respectively forming fourth and fifth portions PO4 and PO5 in the fourth and fifth inner regions IRG4 and IRG5, and forming a sixth portion PO6 in the outer region ORG. The lower gate electrode LGE and the upper gate electrode UGE may be connected to each other to form a single first gate electrode GE1.

The formation of the second gate electrode GE2 may further include forming an isolation pattern ISP between the lower gate electrode LGE and the upper gate electrode UGE. The isolation pattern ISP may separate the lower and upper gate electrodes LGE and UGE from each other. For example, in the formation of the second gate electrode, the lower gate electrode LGE that fills the first, second, and third inner regions IRG1, IRG2, and IRG3 may be formed first, then the isolation pattern ISP may be formed on the lower gate electrode LGE and recessed to allow a top surface of the isolation pattern ISP to rest at a level between levels of top and bottom surfaces of the dummy channel pattern DSP, and the upper gate electrode UGE that fills the fourth and fifth inner regions IRG4 and IRG5 may be formed on the isolation pattern ISP.

The first and second gate electrodes GE1 and GE2 may be recessed to have their reduced heights. Gate capping patterns GP may be formed on the recessed first and second gate electrodes GE1 and GE2. The gate capping pattern GP may undergo a planarization process to allow the gate capping pattern GP to have a top surface coplanar with that of the second interlayer dielectric layer 120.

Referring back to FIGS. 5 and 6A to 6E, a third interlayer dielectric layer 130 may be formed on the second interlayer dielectric layer 120. A first active contact AC1 may be formed to penetrate the first, second, and third interlayer dielectric layers 110, 120, and 130 and may be coupled to the lower source/drain pattern SD1. A second active contact AC2 may be formed to penetrate the second and third interlayer dielectric layers 120 and 130 and may be coupled to the upper source/drain pattern SD2.

An upper gate contact UGC may be formed to penetrate the third interlayer dielectric layer 130 and the gate capping pattern GP, and may be coupled to the upper gate electrode UGE. A lower gate contact LGC may be formed to penetrate the third interlayer dielectric layer 130, the gate capping pattern GP, and the upper gate electrode UGE, and may be coupled to the lower gate electrode LGE.

A fourth interlayer dielectric layer 140 may be formed on the third interlayer dielectric layer 130. A first metal layer M1 may be formed in the fourth interlayer dielectric layer 140. The formation of the first metal layer M1 may include forming first and second power lines POR1 and POR2 and first to fourth wiring lines MI1 to MI4 on an upper portion of the fourth interlayer dielectric layer 140. Each of the first and second power lines POR1 and POR2 and first to fourth wiring lines MI1 to MI4 may extend in the second direction D2 on the logic cell of the logic circuit LC.

A via VI may be formed beneath each of the first and second power lines POR1 and POR2 and the first to fourth wiring lines MI1 to MI4. The active contacts AC1 and AC2 and the gate contacts UGC and LGC may be electrically connected through the vias VI to the first metal layer M1.

In an embodiment of the present inventive concept, the formation of the vias VI may be followed by the formation of the first and second power lines POR1 and POR2 and the first to fourth wiring lines MI1 to MI4. In an embodiment of the present inventive concept, a dual damascene process may be adopted to form the vias VI together with the first and second power lines POR1 and POR2 and the first to fourth wiring lines MI1 to MI4.

Additional metal layers may be formed on the first metal layer M1. The first metal layer M1 and other additional metal layers on the first metal layer M1 may constitute a back-end-of-line (BEOL) layer of a semiconductor device.

FIGS. 16 to 20 illustrate cross-sectional views taken along line C-C' of FIG. 5, showing a method of forming a second gate electrode according to an embodiment of the present inventive concept.

Figure 16:
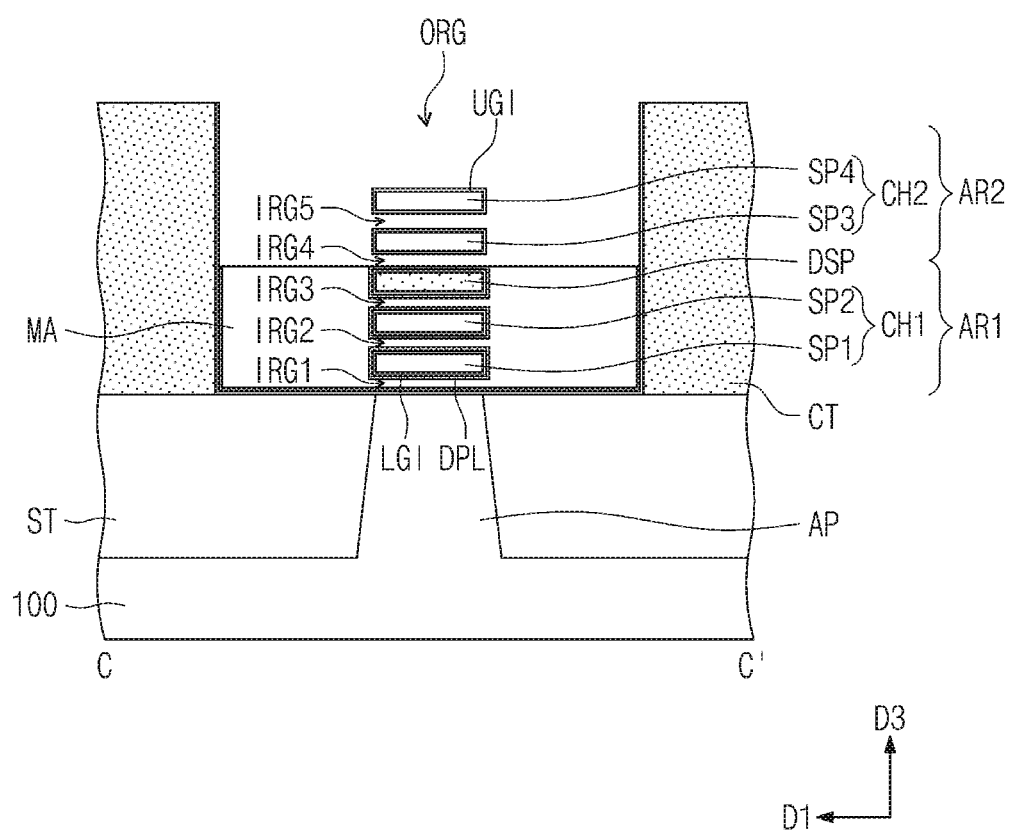
FIGS. 16 to 20 illustrate cross-sectional views taken along line C-C' of FIG. 5, showing a method of forming a second gate electrode according to an embodiment of the present inventive concept.

Referring to FIG. 16, gate dielectric layers UGI and LGI may be conformally formed on a result structure of FIG. 14B. The gate dielectric layers UGI and LGI may include a lower gate dielectric layer LGI on the first and second semiconductor patterns SP1 and SP2 and the dummy channel pattern DSP, and may also include an upper gate dielectric layer UGI on the third and fourth semiconductor patterns SP3 and SP4. For example, the lower gate dielectric layer LGI may cover top, bottom, and opposite side surfaces of each of the first and second semiconductor patterns SP1 and SP2 and the dummy channel pattern DSP, and the upper gate dielectric layer UGI may cover top, bottom, and opposite side surfaces of each of the third and fourth semiconductor patterns SP3 and SP4.

The formation of the lower and upper gate dielectric layers LGI and UGI may include forming a silicon oxide ($SiO_2$) layer on surfaces of the first to fourth semiconductor patterns SP1 to SP4, and forming a high-k dielectric layer on the silicon oxide ($SiO_2$) layer.

A dipole-containing layer DPL may be selectively formed only on the lower gate dielectric layer LGI. For example, the dipole-containing layer DPL may be conformally formed on the lower and upper gate dielectric layers LGI and UGI. A mask layer MA may be formed to cover the lower gate dielectric layer LGI and to expose the upper gate dielectric layer UGI. The mask layer MA may have a top surface at a level similar to that of a top surface of the dummy channel pattern DSP. The mask layer MA may be used as an etching mask to selectively remove the dipole-containing layer DPL on the upper gate dielectric layer UGI. Therefore, the dipole-containing layer DPL may selectively remain only on the lower gate dielectric layer LGI, and not on the upper gate dielectric layer UGI.

The dipole-containing layer DPL may include a dipole element. The dipole element may include, for example, lanthanum (La), aluminum (Al), or a combination thereof. For example, the dipole-containing layer DPL may include, for example, a lanthanum oxide ($La_2O_3$) layer, an aluminum oxide ($Al_2O_3$) layer, or a combination thereof.

Afterwards, the mask layer MA may be removed, and then the dipole-containing layer DPL may undergo an annealing process to diffuse the dipole element from the dipole-containing layer DPL into the lower gate dielectric layer LGI. Therefore, a dipole-interface that may be formed between a silicon oxide ($SiO_2$) layer and a high-k dielectric layer that are included in the lower gate dielectric layer. The dipole-element diffused into the lower gate dielectric layer LGI may adjust an effective work function of a lower gate electrode LGE which will be formed subsequently.

During the annealing process, the dipole-containing layer DPL may discharge the dipole element and at the same time may be removed. The dipole-containing layer DPL may be formed to have an extremely small thickness such as about 1 nm, and thus may be easily removed.

Figure 17:
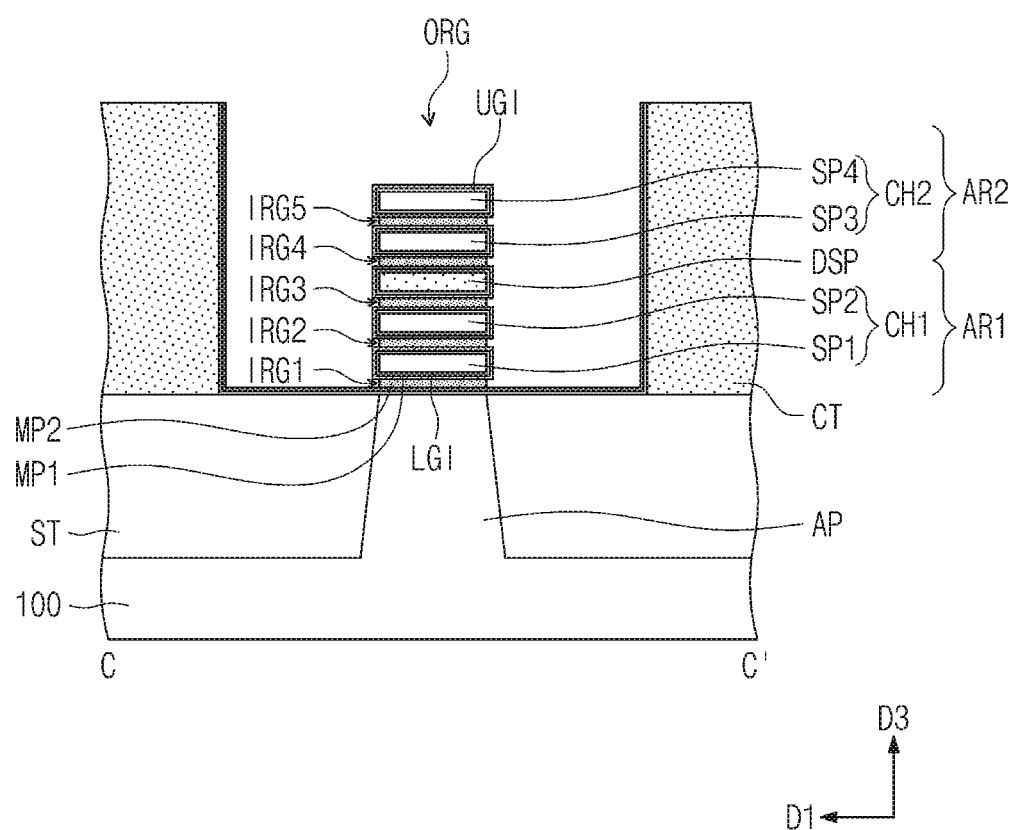

Referring to FIG. 17, a first metal pattern MP1 may be conformally formed on the lower and upper gate dielectric layers LGI and UGI. The first metal pattern MP1 may surround the first to fourth semiconductor patterns SP1 to SP4.

The first metal pattern MP1 may include a first work-function metal (e.g., p-type work-function metal). The formation of the first metal pattern MP1 may include conformally depositing a metal nitride layer on the lower and upper gate dielectric layers LGI and UGI. For example, the first metal pattern MP1 may include, for example, titanium nitride (TiN), tantalum nitride (TaN), titanium oxynitride (TiON), titanium silicon nitride (TiSiN), titanium aluminum nitride (TiAlN), tungsten carbon nitride (WCN), or molybdenum nitride (MoN).

A second metal pattern MP2 may be formed on the first metal pattern MP1. The second metal pattern MP2 may be formed to completely fill the first to fifth inner regions IRG1 to IRG5. The second metal pattern MP2 may be formed also in the outer region ORG.

The second metal pattern MP2 may include a second work-function metal (e.g., n-type work-function metal). The formation of the second metal pattern MP2 may include depositing, on the first metal pattern MP1, a metal carbide doped with (or containing) one or more selected from, for example, silicon (Si) and aluminum (Al). For example, the second metal pattern MP2 may include, for example, aluminum-doped titanium carbide (TiAlC), aluminum-doped tantalum carbide (TaAlC), aluminum-doped vanadium carbide (VAlC), silicon-doped titanium carbide (TiSiC), or silicon-doped tantalum carbide (TaSiC).

The second metal pattern MP2 may undergo an etching process to selectively remove the second metal pattern MP2 in the outer region ORG. For example, the etching process may remove the second metal pattern MP2 in the outer region ORG, and may leave the second metal pattern MP2 in the first to fifth inner regions IRG1 to IRG5.

Figure 18:
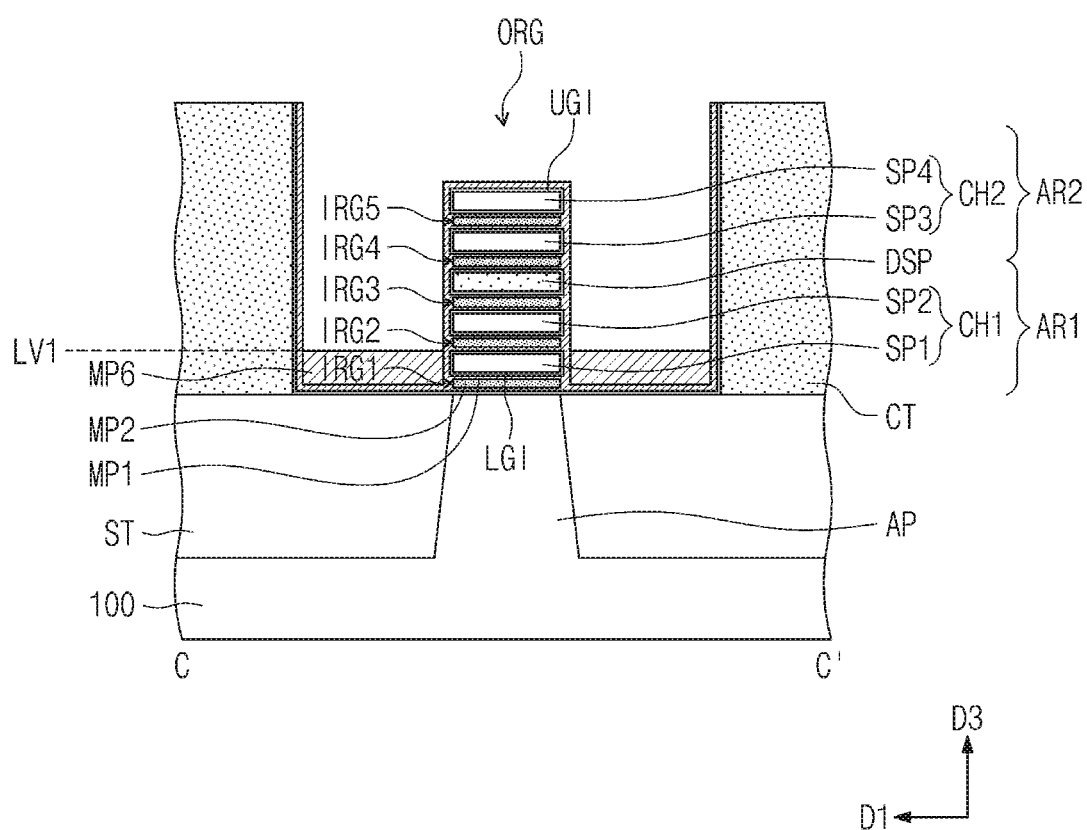

Referring to FIG. 18, a sixth metal pattern MP6 may be formed in a lower portion of the outer region ORG. For example, the sixth metal pattern MP6 may be formed on the first and second metal patterns MP1 and MP2, filling the outer region ORG. Thereafter, the sixth metal pattern MP6 may be recessed to allow its top surface to rest at a first level LV1. For example, the first level LV1 may be the same as or higher than a top surface of the first semiconductor pattern SP1, and the same as or lower than a bottom surface of the second semiconductor pattern SP2. The sixth metal pattern MP6 may include at least one of metals, whose resistances are low, such as, for example, tungsten (W), ruthenium (Ru), aluminum (Al), titanium (Ti), and tantalum (Ta).

Figure 19:
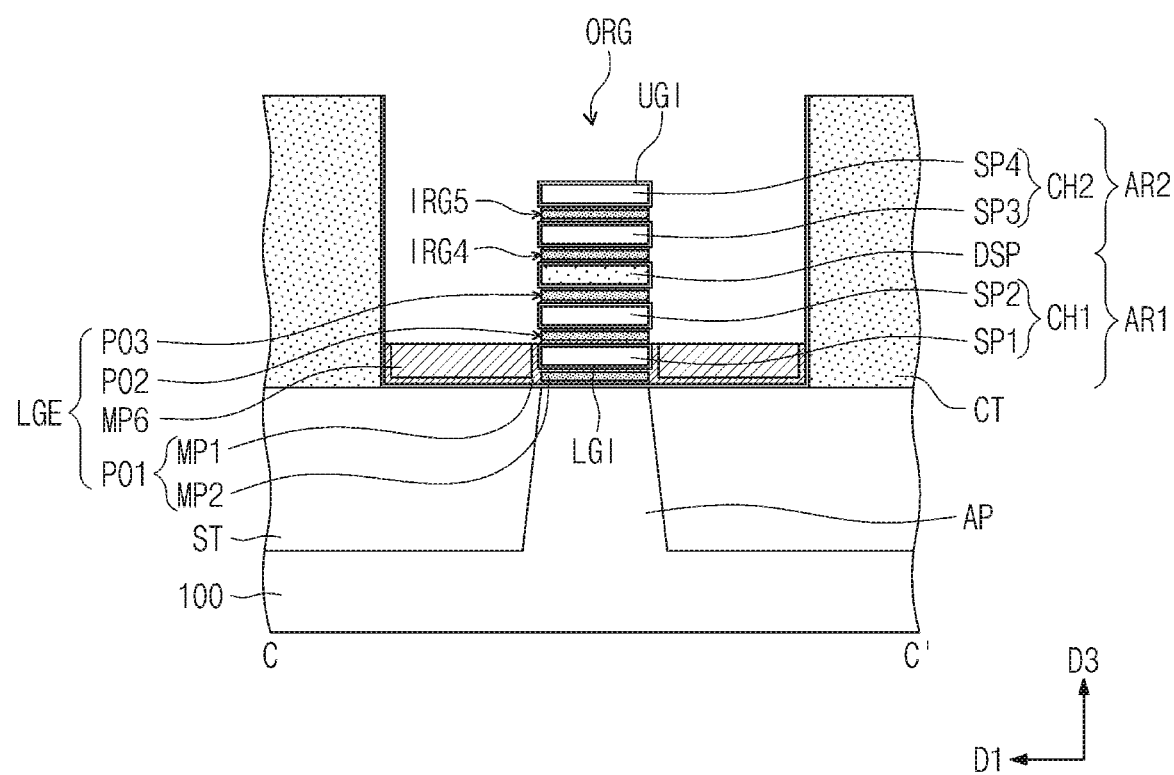

Referring to FIG. 19, the sixth metal pattern MP6 may be used as an etching mask to etch and selectively remove an exposed portion of the first metal pattern MP1. The second metal pattern MP2 may not be removed, and thus the first metal pattern MP1 between the second metal pattern MP2 and the first to fourth semiconductor patterns SP1 to SP4 may not be removed. In addition, the second metal pattern MP2 may also remain which is positioned beneath the top surface of the sixth metal pattern MP6.

An exposed portion of the first metal pattern MP1 may be removed to form a lower gate electrode LGE. The lower gate electrode LGE may include first, second, and third portions PO1, PO2, and PO3 that are respectively formed in the first, second, and third inner regions IRG1, IRG2, and IRG3. Each of the first, second, and third portions PO1, PO2, and PO3 may include a first metal pattern MP1 and a second metal pattern MP2. The lower gate electrode LGE may further include a sixth metal pattern MP6 formed in a lower portion of the outer region ORG.

Figure 20:
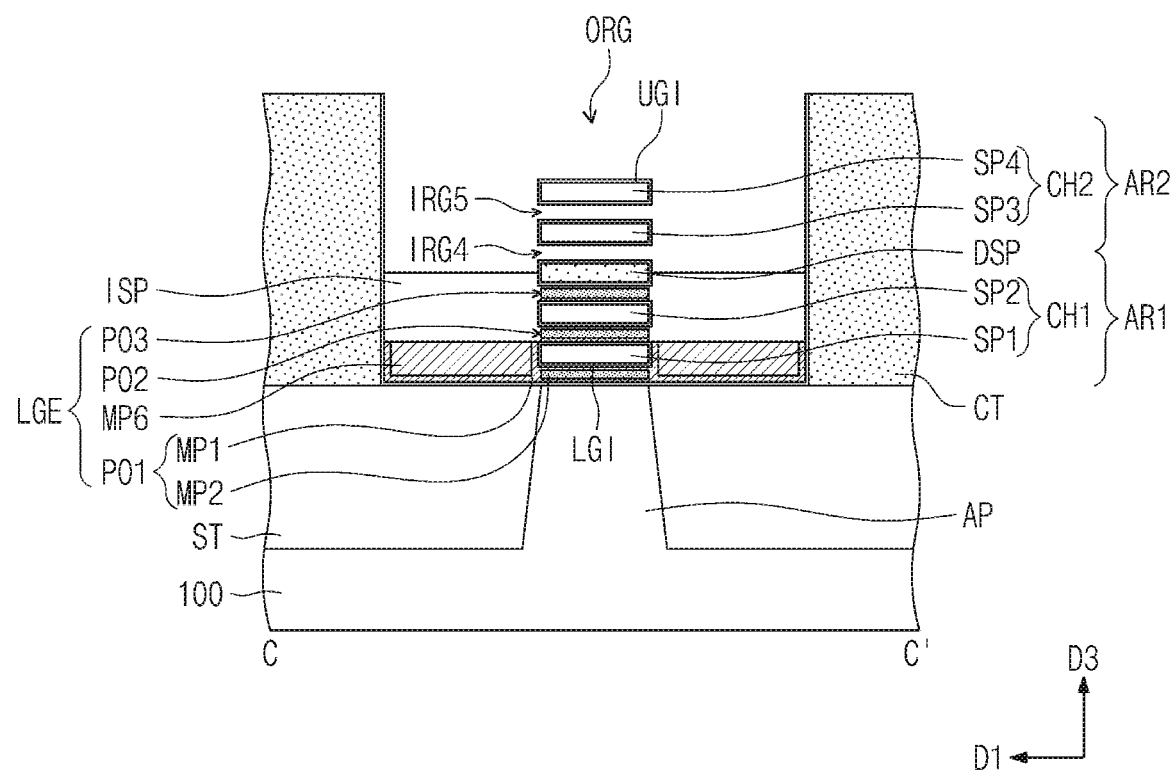

Referring to FIG. 20, an isolation pattern ISP may be formed on the sixth metal pattern MP6. The isolation pattern ISP may be formed to have a top surface at a level between those of top and bottom surfaces of the dummy channel pattern DSP.

The isolation pattern ISP may be used as an etching mask to remove the first and second metal patterns MP1 and MP2 formed in the fourth and fifth inner regions IRG4 and IRG5. Therefore, the upper gate dielectric layer UGI may be exposed.

Referring back to FIG. 15B, a third metal pattern MP3 may be formed on the upper gate dielectric layer UGI. The third metal pattern MP3 may be formed to have a thickness that completely fills the fourth and fifth inner regions IRG4 and IRG5. The third metal pattern MP3 may include a metal nitride layer, as a first work-function metal, the same as or different from that of the first metal pattern MP1.

A fourth metal pattern MP4 may be formed on the third metal pattern MP3, partially filling the outer region ORG. The fourth metal pattern MP4 may include metal carbide, as a second work-function metal, the same as or different from that of the second metal pattern MP2.

A fifth metal pattern MP5 may be formed on the fourth metal pattern MP4, filling an unoccupied portion of the outer region ORG. The fifth metal pattern MP5 may include a first work-function metal (e.g., titanium nitride (TiN)) or a low-resistance metal (e.g., tungsten (W)). In an embodiment of the present inventive concept, the fifth metal pattern MP5 may include a metal the same as that of the sixth metal pattern MP6.

The third to fifth metal patterns MP3 to MP5 may be formed on the isolation pattern ISP, and thus an upper gate electrode UGE may be formed. The upper gate electrode UGE may include fourth and fifth portions PO4 and PO5 that are respectively formed in the fourth and fifth inner regions IRG4 and IRG5. Each of the fourth and fifth portions PO4 and PO5 may include a third metal pattern MP3. The upper gate electrode UGE may further include a sixth portion PO6 formed in the outer region ORG. The sixth portion PO6 may include third, fourth, and fifth metal patterns MP3, MP4, and MP5 that are sequentially stacked.

Figure 21:
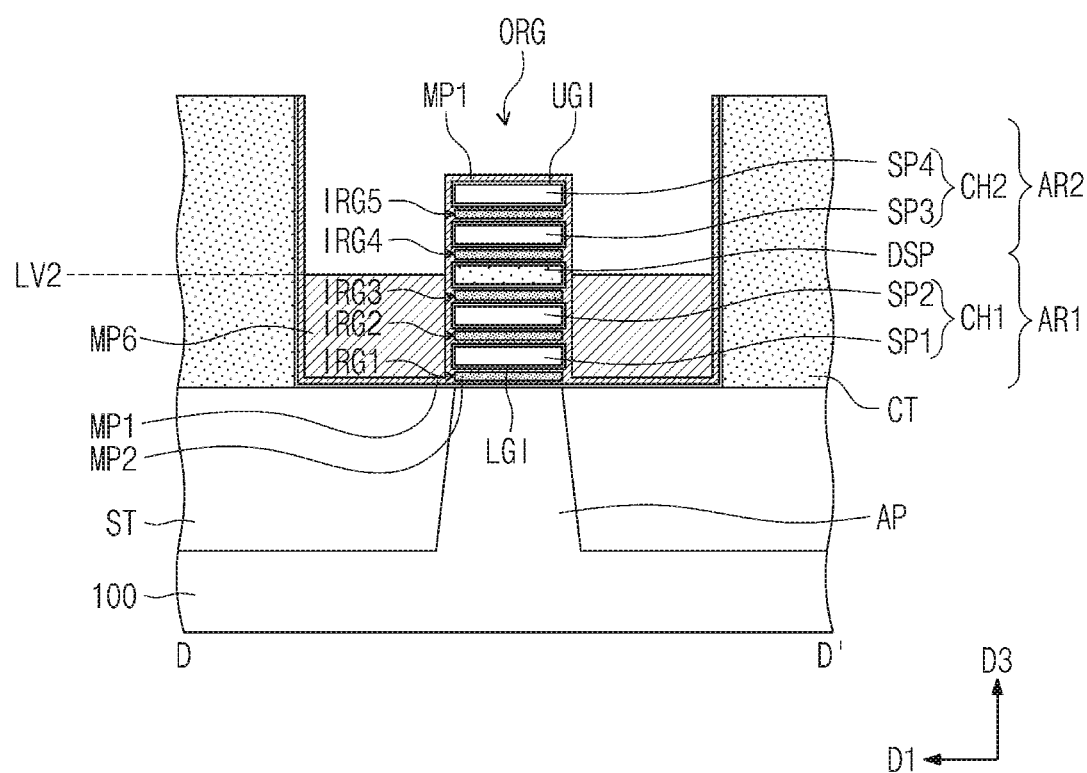
FIGS. 21 and 22 illustrate cross-sectional views taken along line D-D' of FIG. 5, showing a method of forming a first gate electrode according to an embodiment of the present inventive concept.
Figure 22:
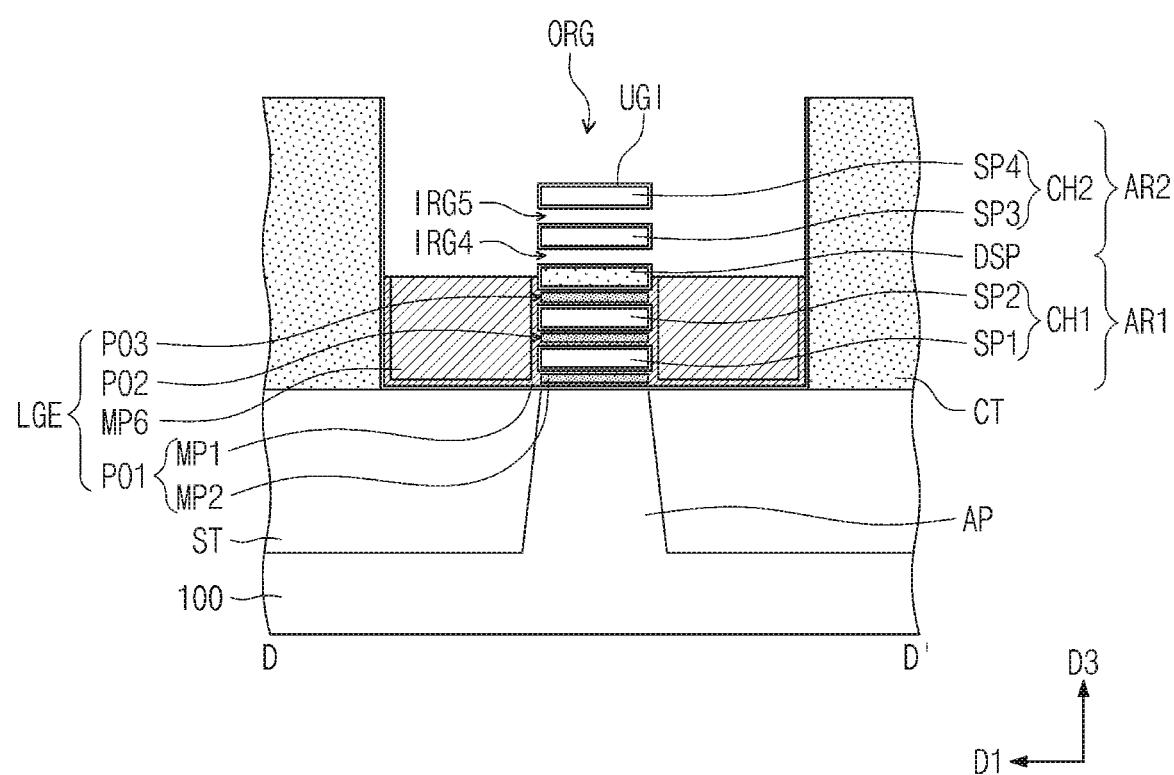

FIGS. 21 and 22 illustrate cross-sectional views taken along line D-D' of FIG. 5, showing a method of forming a first gate electrode according to an embodiment of the present inventive concept.

Referring to FIG. 21, a sixth metal pattern MP6 may be formed on a resultant structure of FIG. 17. The sixth metal pattern MP6 may be recessed to allow its top surface to rest at a second level LV2. The second level LV2 may be higher than the first level LV1. The second level LV2 may be positioned between top and bottom surfaces of the dummy channel pattern DSP.

Referring to FIGS. 22, the sixth metal pattern MP6 may be used as an etching mask to remove the first and second metal patterns MP1 and MP2. The upper gate dielectric layer UGI may thus be exposed.

The first and second metal patterns MP1 and MP2 may remain below the top surface of the sixth metal pattern MP6, and thus a lower gate electrode LGE may be formed. The lower gate electrode LGE may include first, second, and third portions PO1, PO2, and PO3 that are respectively formed in the first, second, and third inner regions IRG1, IRG2, and IRG3. Each of the first, second, and third portions PO1, PO2, and PO3 may include a first metal pattern MP1 and a second metal pattern MP2. The lower gate electrode LGE may further include a sixth metal pattern MP6 formed in a lower portion of the outer region ORG.

Unlike the formation of the second gate electrode GE2 shown in FIG. 20, the formation of the first gate electrode GE1 of FIG. 22 may not include the formation of the isolation pattern ISP or may include the complete removal of the isolation pattern ISP that has been formed. For example, the first gate electrode GE1 is a common gate electrode which does not have the isolation pattern ISP, and the second gate electrode GE2 is a split gate electrode which has the isolation pattern ISP.

Referring back to FIG. 15C, a third metal pattern MP3 may be formed on the upper gate dielectric layer UGI. The third metal pattern MP3 may be formed to have a thickness that completely fills the fourth and fifth inner regions IRG4 and IRG5. A fourth metal pattern MP4 may be formed on the third metal pattern MP3, partially filling the outer region ORG. A fifth metal pattern MP5 may be formed on the fourth metal pattern MP4, filling an unoccupied portion of the outer region ORG. The third to fifth metal patterns MP3 to MP5 may constitute an upper gate electrode UGE.

The isolation pattern ISP may be omitted, and thus the upper gate electrode UGE of the first gate electrode GE1 may be directly formed on and connected to the lower gate electrode LGE of the first gate electrode GE1.

A three-dimensional semiconductor device according to the present inventive concept may achieve a cross-couple structure by using an isolation pattern between a lower gate electrode and an upper gate electrode. Only two split gates may accomplish the cross-couple structure, and thus there may be a reduction in area of a flip-flop cell. As a result, integration of the three-dimensional semiconductor device according to the present inventive concept may be increased.

Although the present inventive concept has been described in connection with some specific embodiments of the present inventive concept illustrated in the accompanying drawings, it will be understood by one of ordinary skill in the art that variations in form and detail may be made therein without departing from the spirit and scope of the present inventive concept as defined in the appended claims. The above disclosed embodiments of the present inventive concept should thus be considered illustrative and not restrictive.

What is claimed is:

1. A three-dimensional semiconductor device, comprising:
    a first active region on a substrate, the first active region including a plurality of lower channel patterns and a plurality of lower source/drain patterns that are alternately arranged along a first direction;
    a second active region on the first active region, the second active region including a plurality of upper channel patterns and a plurality of upper source/drain patterns that are alternately arranged along the first direction;
    a first gate electrode on a first lower channel pattern of the lower channel patterns and on a first upper channel pattern of the upper channel patterns; and
    a second gate electrode on a second lower channel pattern of the lower channel patterns and on a second upper channel pattern of the upper channel patterns,
    wherein the first gate electrode includes:
        a first lower gate electrode on the first lower channel pattern; and
        a first upper gate electrode on the first upper channel pattern,
    wherein the first lower gate electrode and the first upper gate electrode are connected to each other,
    wherein the second gate electrode includes:
        a second lower gate electrode on the second lower channel pattern;
        a second upper gate electrode on the second upper channel pattern; and
        an isolation pattern between the second lower gate electrode and the second upper gate electrode, and
    wherein the second lower gate electrode and the second upper gate electrode are separated from each other by the isolation pattern.

2. The device of claim 1, wherein
    the first lower channel pattern and the first upper channel pattern vertically overlap each other, and
    the second lower channel pattern and the second upper channel pattern vertically overlap each other.

3. The device of claim 1, further comprising:
    a first dummy channel pattern between the first lower channel pattern and the first upper channel pattern; and
    a second dummy channel pattern between the second lower channel pattern and the second upper channel pattern.

4. The device of claim 3, wherein each of the first and second dummy channel patterns includes a silicon oxide layer or a silicon nitride layer.

5. The device of claim 1, wherein
    each of the first and second lower channel patterns includes a first semiconductor pattern and a second semiconductor pattern on the first semiconductor pattern,
    each of the first and second lower gate electrodes surrounds the first and second semiconductor patterns,
    each of the first and second upper channel patterns includes a third semiconductor pattern and a fourth semiconductor pattern on the third semiconductor pattern, and
    each of the first and second upper gate electrodes surrounds the third and fourth semiconductor patterns.

6. The device of claim 1, wherein each of the first and second lower gate electrodes includes:
    a first metal pattern that includes a first work-function metal;
    a second metal pattern on the first metal pattern, the second metal pattern including a second work-function metal; and
    a third metal pattern on the second metal pattern, the third metal pattern including a low-resistance metal,
    wherein a thickness of the third metal pattern included in the first lower gate electrode is greater than a thickness of the third metal pattern included in the second lower gate electrode.

7. The device of claim 6, wherein the thickness of the third metal pattern included in the first lower gate electrode is substantially the same as a sum of the thickness of the third metal pattern included in the second lower gate electrode and a thickness of the isolation pattern.

8. The device of claim 1, further comprising:
    a lower gate dielectric layer between the first lower channel pattern and the first lower gate electrode; and
    an upper gate dielectric layer between the first upper channel pattern and the first upper gate electrode,
    wherein the lower gate dielectric layer contains a dipole element, and
    wherein a concentration of the dipole element in the lower gate dielectric layer is greater than a concentration of the dipole element in the upper gate dielectric layer.

9. The device of claim 1, further comprising:
    an upper gate contact coupled to the second upper gate electrode;
    a lower gate contact coupled to the second lower gate electrode;
    a first wiring line electrically connected to the upper gate contact; and
    a second wiring line electrically connected to the lower gate contact.

10. The device of claim 9, further comprising a contact spacer on a sidewall of the lower gate contact,
    wherein the lower gate contact penetrates and is insulated from the second upper gate electrode by the contact spacer.

11. A three-dimensional semiconductor device, comprising:
    a first active region on a substrate and a second active region on the first active region;
    a first gate electrode and a second gate electrode on the first active region and the second active region, wherein the first gate electrode includes
  a first lower gate electrode on the first active region,
  a first upper gate electrode on the second active region, and
  a first isolation pattern between the first lower gate electrode and the first upper gate electrode, and
wherein the second gate electrode includes
  a second lower gate electrode on the first active region,
  a second upper gate electrode on the second active region, and
  a second isolation pattern between the second lower gate electrode and the second upper gate electrode;
a first upper gate contact coupled to the first upper gate electrode;
a first lower gate contact coupled to the first lower gate electrode;
a second upper gate contact coupled to the second upper gate electrode;
a second lower gate contact coupled to the second lower gate electrode;
a first wiring line electrically connected to the first upper gate contact and the second lower gate contact; and
a second wiring line electrically connected to the first lower gate contact and the second upper gate contact.

12. The device of claim 11, wherein
the first wiring line is configured to allow a first signal to be applied therethrough to the first upper gate electrode and the second lower gate electrode,
the second wiring line is configured to allow a second signal to be applied therethrough to the second upper gate electrode and the first lower gate electrode, and
the second signal is an inverse signal to the first signal.

13. The device of claim 11, wherein
the first lower gate electrode and the first upper gate electrode vertically overlap each other,
the first lower gate electrode and the first upper gate electrode are separated from each other by the first isolation pattern,
the second lower gate electrode and the second upper gate electrode vertically overlap each other, and
the second lower gate electrode and the second upper gate electrode are separated from each other by the second isolation pattern.

14. The device of claim 11, wherein
each of the first and second lower gate electrodes surrounds a plurality of semiconductor patterns of the first active region, and
each of the first and second upper gate electrodes surrounds a plurality of semiconductor patterns of the second active region.

15. The device of claim 11, further comprising a dummy channel pattern between the first active region and the second active region,
wherein a top surface of each of the first and second isolation patterns is at a level between levels of top and bottom surfaces of the dummy channel pattern.

16. A three-dimensional semiconductor device, comprising:
a first active region on a substrate, the first active region including a lower channel pattern and a lower source/drain pattern connected to the lower channel pattern;
a second active region on the first active region, the second active region including an upper channel pattern and an upper source/drain pattern connected to the upper channel pattern;
a dummy channel pattern between the lower channel pattern and the upper channel pattern; and
a gate electrode on the lower channel pattern, the dummy channel pattern, and the upper channel pattern,
wherein the gate electrode includes:
  a lower gate electrode on the lower channel pattern;
  an upper gate electrode on the upper channel pattern; and
  an isolation pattern between the lower gate electrode and the upper gate electrode.

17. The device of claim 16, wherein the lower gate electrode and the upper gate electrode are separated from each other by the isolation pattern.

18. The device of claim 16, wherein a top surface of the isolation pattern is at a level between levels of top and bottom surfaces of the dummy channel pattern.

19. The device of claim 16, wherein
the lower channel pattern includes a first semiconductor pattern,
the upper channel pattern includes a second semiconductor pattern,
the dummy channel pattern includes a dielectric material, and
the first semiconductor pattern, the second semiconductor pattern, and the dummy channel pattern vertically overlap each other.

20. The device of claim 16, further comprising:
an upper gate contact coupled to the upper gate electrode;
a lower gate contact coupled to the lower gate electrode;
a first wiring line electrically connected to the upper gate contact; and
a second wiring line electrically connected to the lower gate contact.

* * * * *